(12) United States Patent
Baba

(10) Patent No.: US 9,496,301 B2
(45) Date of Patent: Nov. 15, 2016

(54) IMAGING APPARATUS AND ELECTRONIC SYSTEM

(71) Applicant: SONY CORPORATION, Tokyo (JP)

(72) Inventor: Tomohiko Baba, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/391,475

(22) PCT Filed: Apr. 16, 2013

(86) PCT No.: PCT/JP2013/002578
§ 371 (c)(1),
(2) Date: Oct. 9, 2014

(87) PCT Pub. No.: WO2013/161216
PCT Pub. Date: Oct. 31, 2013

(65) Prior Publication Data
US 2015/0061064 A1    Mar. 5, 2015

(30) Foreign Application Priority Data

Apr. 26, 2012 (JP) ................. 2012-100679

(51) Int. Cl.
*H01L 27/146* (2006.01)
*G02B 13/00* (2006.01)
*G02B 13/16* (2006.01)
*G02B 13/18* (2006.01)

(52) U.S. Cl.
CPC ....... *H01L 27/14625* (2013.01); *G02B 13/002* (2013.01); *G02B 13/006* (2013.01); *G02B 13/16* (2013.01); *G02B 13/18* (2013.01); *H01L 27/14607* (2013.01)

(58) Field of Classification Search
CPC .............. H01L 27/14625; H01L 27/14607; G02B 13/16; G02B 13/18; G02B 13/0045; G02B 13/02
See application file for complete search history.

(56) References Cited

U.S. PATENT DOCUMENTS

| | | | | |
|---|---|---|---|---|
| 5,007,720 A | * | 4/1991 | Hamanishi | G02B 13/02 359/693 |
| 5,646,779 A | * | 7/1997 | Sato | G02B 13/02 359/554 |

(Continued)

FOREIGN PATENT DOCUMENTS

| | | |
|---|---|---|
| DE | 3230195 A1 | 3/1983 |
| EP | 1122791 A2 | 8/2001 |

(Continued)

OTHER PUBLICATIONS

Rim et al., "The optical advantages of curved focal plane arrays," Optics Express, 2008, vol. 16, No. 7, pp. 4965-4971.

(Continued)

*Primary Examiner* — Ermias Woldegeorgis
(74) *Attorney, Agent, or Firm* — Chip Law Group

(57) ABSTRACT

An imaging apparatus includes: a lens group formed of one or more lens elements; and an imaging device having a light receiving surface on which the lens group forms an image of an object, wherein the light receiving surface of the imaging device is a curved surface that is concave toward the lens group, and the light receiving surface of the imaging device has an aspheric shape so shaped that a tangential angle that is an angle between a tangential line circumscribing an edge of the light receiving surface and a plane perpendicular to an optical axis of the lens group is smaller than the tangential angle provided when the light receiving surface has a spherical shape.

19 Claims, 37 Drawing Sheets

(56) References Cited

U.S. PATENT DOCUMENTS

| | | |
|---|---|---|
| 6,618,093 B1 | 9/2003 | Levy |
| 2003/0020822 A1 | 1/2003 | Sato |
| 2005/0109918 A1 | 5/2005 | Nikzad et al. |
| 2005/0219716 A1* | 10/2005 | Koike .................... G02B 13/18 359/791 |
| 2011/0176215 A1* | 7/2011 | Mouri .................... G02B 1/113 359/601 |

FOREIGN PATENT DOCUMENTS

| | | |
|---|---|---|
| EP | 1132967 A2 | 9/2001 |
| EP | 2437298 A1 | 4/2012 |
| JP | H01 202989 A | 8/1989 |
| JP | 2004-312239 | 11/2004 |
| JP | 2004-356175 | 12/2004 |
| JP | 2004 356175 A | 12/2004 |
| JP | 2004356175 A * | 12/2004 |

OTHER PUBLICATIONS

International Search Report and Written Opinion prepared by the European Patent Office on Jul. 24, 2013, for International Application No. PCT/JP2013/002578.

E. Hecht: "Optics second edition", Dec. 31, 1989; pp. 228-230.

* cited by examiner

IMAGING APPARATUS AND ELECTRONIC SYSTEM

CROSS REFERENCE TO RELATED APPLICATIONS

This application is a national stage application under 35 U.S.C. 371 and claims the benefit of PCT Application No. PCT/JP2013/002578 having an international filing date of Apr. 16, 2013, which designated the United States, which PCT application claimed the benefit of Japanese Patent Application No. 2012-100679 filed Apr. 26, 2013, the disclosure of both the above-identified applications are incorporated herein by reference.

TECHNICAL FIELD

The present technology relates to an imaging apparatus and an electronic system, and particularly to an imaging apparatus and an electronic system that can be reduced in size.

BACKGROUND ART

Imaging apparatus incorporated in recent mobile phones and PCs (personal computers) are typically strongly required to have high resolution, low cost, and compactness. Since the cell intervals in CCD (charge coupled device) and CMOS (complementary metal oxide semiconductor) image sensors and other imaging devices have been drastically reduced, an optical system is typically required to have higher imaging performance by suppressing optical aberrations by a greater amount than in related art.

To achieve the requirement described above by simply modifying the optical system, for example, the following problems occur: the number of lenses increases; high assembly precision is typically required; and each lens needs to be manufactured to a thickness that is very difficult to achieve.

To solve the problems, a technology for simplifying each lens by using a spherically curved imaging device to reduce the burden of image plane correction on the optical system has been proposed (see PTL 1, for example).

PTL 1 describes an optical system having a front-diaphragm-type one-group-two-lens configuration in which two lenses separately formed in plastic molding processes are bonded to each other. The technology described in PTL 1 is, however, problematic, for example, in that no infrared removal filter is incorporated and a curved imaging device produces barrel-shaped optical distortion. These problems only allow the optical system to be used with a small pixel number configuration, such as the CIF (common intermediate format) and VGA (video graphics array) standards.

NPL 1 discloses an approach to randomly arranged pixels that allows an imaging device to be curved.

CITATION LIST

Patent Literature

PTL 1: JP-A-2004-312239

Non Patent Literature

NPL 1: "The optical advantages of curved focal plane arrays," Optical EXPRESS 4965/Vol. 16, No. 7, 31 Mar. 2008

SUMMARY OF INVENTION

Technical Problem

In an imaging apparatus that at least needs to be reduced in size, however, randomly arranging the pixels results in a decrease in an effective region of the pixels. The approach described in NPL 1 is not preferable in this sense.

In an imaging device in an actual imaging apparatus, in particular, it is desired not to reduce the effective region of the pixels but to curve only the effective region and maintain a region around the curved effective region flat as in a typical chip.

The configuration described above is, however, prone to breakage because a large force acts on the boundary between the curved portion and the flat portion.

Solution to Problem

In view of the circumstances described above, and it is desirable to achieve size reduction in a more reliable manner.

An imaging apparatus according to an embodiment of the present technology includes a lens group formed of one or more lens elements and an imaging device having a light receiving surface on which the lens group forms an image of an object. The light receiving surface of the imaging device is a curved surface that is concave toward the lens group, and the light receiving surface of the imaging device has an aspheric shape so shaped that a tangential angle that is an angle between a tangential line circumscribing an edge of the light receiving surface and a plane perpendicular to an optical axis of the lens group is smaller than the tangential angle provided when the light receiving surface has a spherical shape.

An intersection of a normal to a tangential line circumscribing the light receiving surface at 100% of an image height and the optical axis of the lens group may be so set that the intersection is farther away from the light receiving surface than an intersection of a normal to a tangential line circumscribing the light receiving surface at 0 to 90% of the image height and the optical axis.

The tangential angle at the edge of the light receiving surface may be set to 35 degrees or smaller.

A first lens group and a second lens group may be disposed as the lens group and arranged from the side where the object is present toward the light receiving surface. The first lens group may be an in-lens-diaphragm lens group, and each surface of the second lens group may be convex toward the light receiving surface.

A focal length f of the lens group, a focal length fg1 of the first lens group, and a focal length fg2 of the second lens group may be set to satisfy the following conditional expressions:

$$0.5 \leq fg1/f \leq 5 \text{ and } 2 \leq fg2/f \text{ or } fg2/f \leq -2.$$

At least one of the surfaces of the second lens group may be configured to have an aspheric shape.

The first lens group may be formed of the following components sequentially arranged from the object side toward the light receiving surface: a first lens element; a transparent member having a diaphragm; and a second lens element, and the first lens element may be configured to have a surface on the object side that is convex toward the object.

The first lens group may be formed of the following components sequentially arranged from the object side toward the light receiving surface: a first lens element; a second lens element; a transparent member having a diaphragm; and a third lens element, and the first lens element may be configured to have a surface on the object side that is convex toward the object.

The first lens group may be formed of the following components sequentially arranged from the object side toward the light receiving surface: a first lens element; a second lens element; a third lens element; a transparent member having a diaphragm; and a fourth lens element, and the first lens element may be configured to have a surface on the object side that is convex toward the object.

The first lens group may be formed of the following components sequentially arranged from the object side toward the light receiving surface: a first lens element having a meniscus shape; a second lens element; a transparent member having a diaphragm; and a third lens element. The first lens element may be configured to be convex toward the object. The second lens element may be configured to have a surface on the object side that is convex toward the object. The first lens element and the second lens element may be configured to sandwich air.

The first lens group may be formed of the following components sequentially arranged from the object side toward the light receiving surface: a first lens element having a meniscus shape; a second lens element; a transparent member having a diaphragm; a third lens element; and a fourth lens element. The first lens element may be configured to be convex toward the object. The second lens element may be configured to have a surface on the object side that is convex toward the object. The first lens element and the second lens element may be configured to sandwich air.

The first lens group may be formed of the following components sequentially arranged from the object side toward the light receiving surface: a first lens element having a meniscus shape; a second lens element; a diaphragm; and a third lens element. The first lens element may be configured to be convex toward the object. The first lens element and the second lens element may be configured to sandwich air, and the diaphragm and the third lens element may be configured to sandwich air.

The first lens group may be formed of the following components sequentially arranged from the object side toward the light receiving surface: a first lens element having a meniscus shape; a diaphragm; and a second lens element. The first lens element may be configured to be convex toward the object. The second lens element may be configured to have a surface on the object side that is convex toward the object. The first lens element and the diaphragm may be configured to sandwich air, and the diaphragm and the second lens element may be configured to sandwich air.

The lens group may be formed of the following components sequentially arranged from the side where the object is present toward the light receiving surface: a first lens element; a transparent member having a diaphragm; and a second lens element, and the first lens element may be configured to have a surface on the object side that is convex toward the object.

The lens group may be formed of the following components sequentially arranged from the object side toward the light receiving surface: a first lens element; a second lens element; a transparent member having a diaphragm; and a third lens element, and the first lens element may be configured to have a surface on the object side that is convex toward the object.

The lens group may be formed of the following components sequentially arranged from the object side toward the light receiving surface: a first lens element; a second lens element; a third lens element; a transparent member having a diaphragm; and a fourth lens element, and the first lens element may be configured to have a surface on the object side that is convex toward the object.

The lens group may be configured to produce positive optical distortion.

The amount of optical distortion may be set to 5% or greater.

An effective radius of the lens group D_lens and an effective radius of the imaging device D_im satisfy the following conditional expression: 0.35<D_lens/D_im<0.75.

An electronic system according to an embodiment of the present technology is an electronic system including an imaging apparatus, and the imaging apparatus includes a lens group formed of one or more lens elements and an imaging device having a light receiving surface on which the lens group forms an image of an object. The light receiving surface of the imaging device is a curved surface that is concave toward the lens group, and the light receiving surface of the imaging device has an aspheric shape so shaped that a tangential angle that is an angle between a tangential line circumscribing an edge of the light receiving surface and a plane perpendicular to an optical axis of the lens group is smaller than the tangential angle provided when the light receiving surface has a spherical shape.

In an embodiment of the present technology, the light receiving surface of the imaging device is a curved surface that is concave toward the lens group, and the light receiving surface of the imaging device has an aspheric shape so shaped that a tangential angle that is an angle between a tangential line circumscribing an edge of the light receiving surface and a plane perpendicular to an optical axis of the lens group is smaller than the tangential angle provided when the light receiving surface has a spherical shape.

Advantageous Effects of Invention

According to the embodiment of the present technology, size reduction is achieved in a more reliable manner.

DESCRIPTION OF EMBODIMENTS

Embodiments of the present technology will be described below with reference to the drawings.

1. First Embodiment

Figure 1:
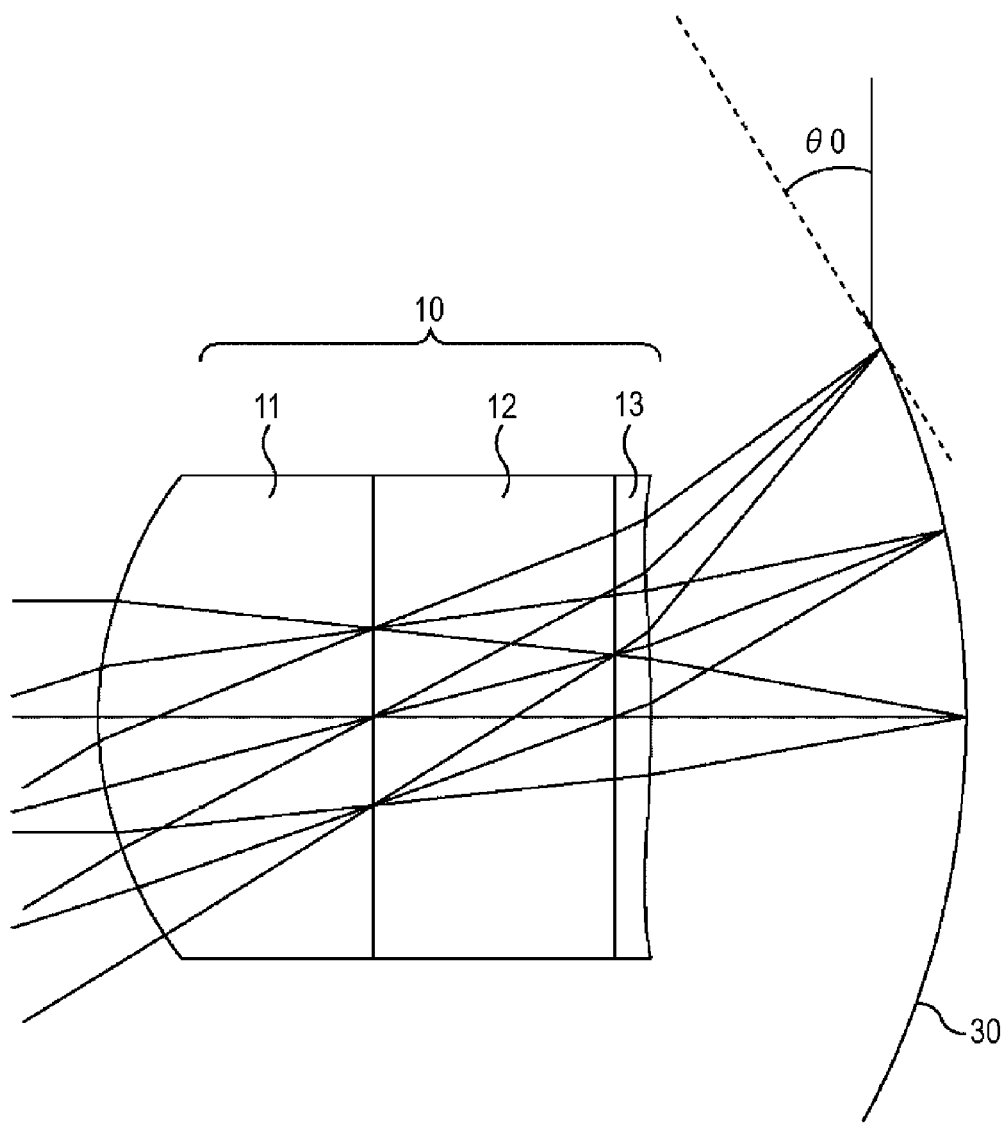
FIG. 1 shows an example of the configuration of an imaging apparatus of related art.

FIG. 1 shows an example of the configuration of an imaging apparatus of related art.

The imaging apparatus shown in FIG. 1 is formed of a lens group 10 and an imaging device 30. The lens group 10 is formed of a lens element 11, a transparent member 12, and a lens element 13. The transparent member 12 has a diaphragm and an infrared removal filter.

In the imaging apparatus shown in FIG. 1, the imaging device 30 has a curved light receiving surface that is a spherical surface concave toward the lens group 10.

The angle between a tangential line circumscribing the light receiving surface of the imaging device 30 and a plane perpendicular to the optical axis of the lens group 10 is now called a tangential angle. A tangential angle

θ0 at the edge (outermost circumferential portion) of the light receiving surface of the imaging device 30 is typically about 30 degrees, and it has been difficult to drastically reduce the tangential angle

θ0 in related art. The reason for this is that the curvature of the imaging device 30 is increased to allow the imaging apparatus shown in FIG. 1 to employ single-group design.

Figure 2:
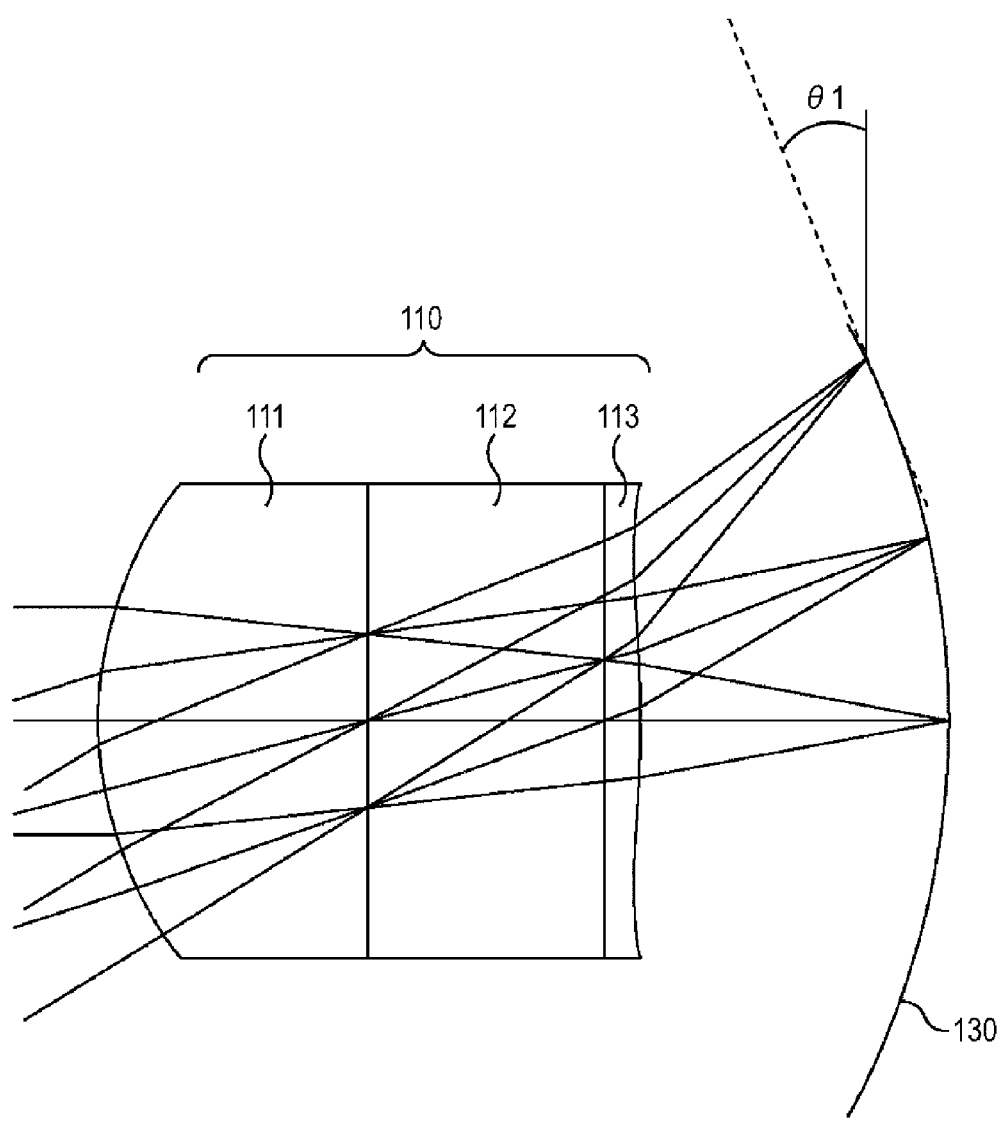
FIG. 2 shows an example of the configuration of an imaging apparatus according to a first embodiment to which the present technology is applied.

FIG. 2 shows an example of the configuration of an imaging apparatus according to a first embodiment to which the present technology is applied.

The imaging apparatus shown in FIG. 2 is formed of a lens group 110 and an imaging device 130. The imaging apparatus shown in FIG. 2 is, for example, incorporated in a small electronic system, such as a mobile phone and a mobile PC.

The lens group 110 is configured as a fixed-focal-length lens and formed of a lens element 111, a transparent member 112, and a lens element 113 sequentially arranged from the object (subject) side toward the light receiving surface of the imaging device 130. The lens element 111 has an object-side surface that is convex toward an object, and the transparent member 112 has a diaphragm and an infrared removal filter. The lens elements 111 and 113 are desirably formed in a replica method in which a UV curable resin is transferred onto the transparent member 112 and irradiated with UV light.

Each of the lens elements 111 and 113 can alternatively have a doublet configuration in which the lenses therein are made of two different glass materials and formed in two separate processes, a triplet configuration in which the lenses therein are made of three different glass materials and formed in three separate processes, or a configuration in which the lenses therein are made of four or more different glass materials and formed in four or more separate processes.

Although not shown, a cover glass plate, an infrared removal filter, a low-pass filter, and other optical members each of which is made of a resin or glass material may further be disposed on the object side of the lens group 110 or between the lens group 110 and the imaging device 130.

The imaging device 130 is formed, for example, of a CCD (charge coupled device) image sensor or a CMOS (complementary metal oxide semiconductor) image sensor, and the light receiving surface thereof is so disposed that it coincides with an image formation plane of the lens group 110. Further, the light receiving surface of the imaging device 130 is a curved surface having an aspheric shape and concave toward the lens group 110.

A tangential angle

θ1 at the edge (outermost circumferential portion) of the light receiving surface of the imaging device 130 is smaller than the tangential angle

θ0 at the edge of the light receiving surface of the imaging device 30 shown in FIG. 1 and set to about 22 degrees. The small tangential angle

θ1 is achieved by the fact that the optical system itself has an optimum image plane having a shape close to a spherical plane but the lens has a best image plane similar to a hyperbola.

The intersection of the normal to the tangential line that circumscribes the light receiving surface of the imaging device 130 at 100% of the image height and the optical axis of the lens group 110 is farther away from the light receiving surface of the imaging device 130 than the intersection of the normal to the tangential line that circumscribes the light receiving surface at 0 to 90% of the image height and the optical axis.

In the embodiment of the present technology, the tangential angle at the edge of the light receiving surface (effective region) of the imaging device is set to 35 degrees or smaller.

Since the tangential angle can be reduced as described above, the imaging device can be readily curved, and breakage resulting from a large force acting on the boundary between the curved portion and the flat portion will not occur. The imaging apparatus itself can therefore be more reliably reduced in size.

The lens group 110, which is a fixed-focal-length lens, is configured to satisfy the following conditional expression (1).

The conditional expression (1) defines the relationship between the effective radius of a lens and the effective radius of an imaging device.

$$0.35 < D\_lens/D\_im < 0.75 \qquad (1)$$

In the conditional expression (1), D_lens denotes the effective radius of the lens group 110, and D_im denotes the effective radius of the imaging device 130. The conditional expression (1) is necessary from the following reason.

When an optical system includes a lens having a very large effective diameter, a symmetrical lens arrangement and hence optimum aberration correction are not maintained. It is therefore necessary to set an upper limit. On the other hand, when an optical system includes a lens having a small effective diameter, a principal ray from the lens is incident on the imaging device at a large angle of incidence, which causes the curvature of the curved imaging device to increase and hence the tangential angle could be greater than 35 degrees, which is the target value in the embodiment of the present technology. It is therefore necessary to set a lower limit.

In the present embodiment, when the distance from a tangential plane at the vertex of the aspheric surface to the point on the aspheric surface where the height from the optical axis is y is denoted as X, the shape of an aspheric surface of a fixed-focal-length lens is expressed by the following aspheric surface equation.

$$X = \frac{cy^2}{1 + \sqrt{1 - (1+k)c^2 y^2}} + Ay^4 + By^6 + Cy^8 + Dy^{10} + Ey^{12} + Fy^{14} \qquad [\text{Math. 1}]$$

In the aspheric surface equation described above, it is assumed that the direction from the object side toward the image plane side is positive, and the symbols in the equation denote the following parameters: k denotes a conical coefficient; c denotes the reciprocal of the radius of curvature r at the vertex of the aspheric surface (1/r); A denotes a fourth aspheric coefficient; B denotes a sixth aspheric coefficient; C denotes an eighth aspheric coefficient; D denotes a tenth aspheric coefficient; E denotes a twelfth aspheric coefficient; and F denotes a fourteenth aspheric coefficient.

In the following sections, a description will be made of specific examples of the imaging apparatus according to the first embodiment described above.

Example 1

Figure 3:
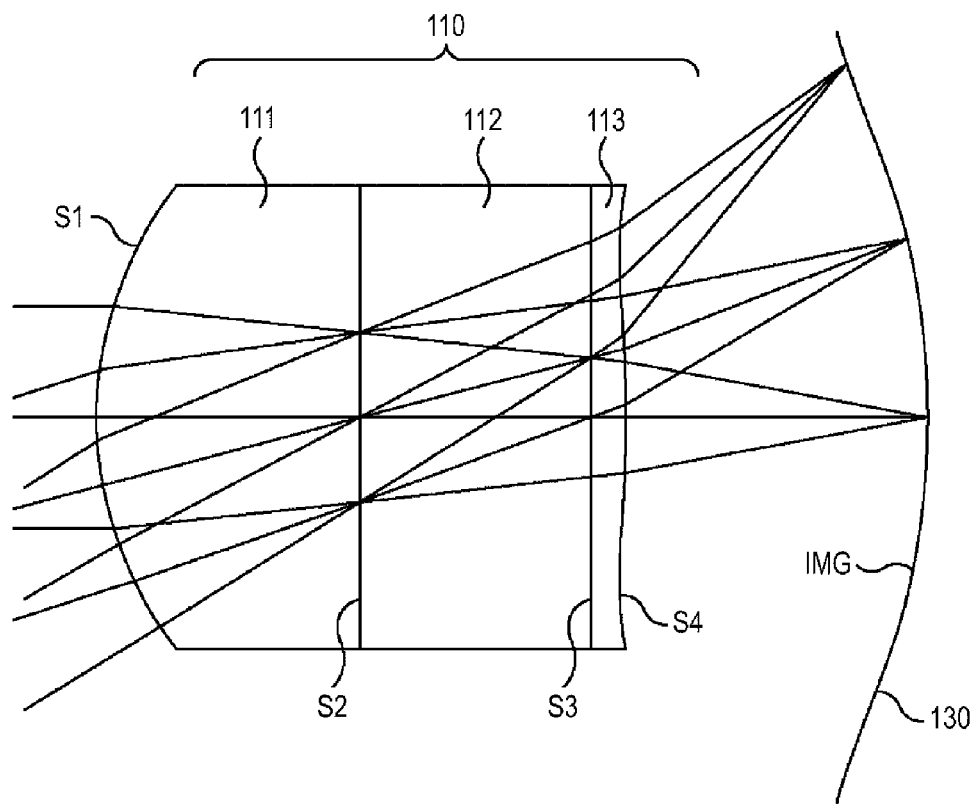
FIG. 3 shows an example of the configuration of an imaging apparatus according to Example 1.

FIG. 3 shows an example of the configuration of an imaging apparatus for a ⅙-size CMOS image sensor having 3-mega pixels arranged at 1.1-μm intervals.

The imaging apparatus shown in FIG. 3 is formed of a lens group 110 and an imaging device 130.

The lens group 110 is formed of a lens element 111, a transparent member 112, and a lens element 113 sequentially arranged from the object side toward the light receiving surface of the imaging device 130 and boned to each other. The lens element 111 has an object-side surface that is convex toward an object, and the transparent member 112 has a diaphragm and an infrared removal filter.

The lens element 111 is desirably formed in a replica method in which a UV curable resin is transferred onto the transparent member 112 and irradiated with UV light. Similarly, the lens element 113 is desirably formed in the replica method on the opposite side of the transparent member 112 to the surface on which the lens element 111 has been formed. Specifically, the lens elements 111 and 113 can be formed, for example, by using an NT33 glass material manufactured by NITTO DENKO CORPORATION on opposite sides of a D263T glass substrate manufactured by SCHOTT AG.

The light receiving surface of the imaging device 130 is a curved surface having an aspheric shape and concave toward the lens group 110. In FIG. 3, the tangential angle is set to 19.8 degrees.

In FIG. 3, the surfaces of the lens element 111, the transparent member 112, and the lens element 113 and the light receiving surface of the imaging device 130 are labeled with surface numbers S1, S2, S3, S4, and IMG.

Table 1 shows the radius of curvature R (mm), the distance d (mm), the refractive index nd, and the dispersion vd associated with the surfaces corresponding to the surface numbers in the imaging apparatus shown in FIG. 3.

TABLE 1

| Surface number | R | d | nd | vd |
| --- | --- | --- | --- | --- |
| S1 | 1.375 | 1.029 | 1.53 | 51.7 |
| S2 | INFINITY | 0.900 | 1.52 | 55.0 |
| S3 | INFINITY | 0.138 | 1.53 | 51.7 |
| S4 | −5.276 | 1.183 | | |
| IMG | −3.000 | 0.000 | | |

Table 2 shows the fourth, sixth, eighth, and tenth aspheric coefficients of aspheric surfaces in the imaging apparatus shown in FIG. 3, specifically, the surface S1 of the lens element 111, the surface S4 of the lens element 113, and the light receiving surface IMG of the imaging device 130. In Table 2, K denotes the conic coefficient, A denotes the fourth aspheric coefficient; B denotes the sixth aspheric coefficient; C denotes the eighth aspheric coefficient; and D denotes the tenth aspheric coefficient.

TABLE 2

| | | | | | |
|---|---|---|---|---|---|
| Surface S1 | K: −0.714 | A: 0.882E−02 | B: 0.246E−01 | C: −0.462E−01 | D: 0.213E−01 |
| Surface S4 | K: −1.000 | A: 0.129E+00 | B: −0.670E−01 | C: 0.103E+00 | D: −0.423E−01 |
| Surface IMG | K: 0.902 | A: −0.113E−01 | B: 0.668E−02 | C: 0.397E−02 | D: −0.813E−03 |

Table 3 shows the focal length f, the numerical aperture F, the half viewing angle ω,
the lens length H of the lens group 110 in the imaging apparatus shown in FIG. 3. In the example shown in FIG. 3, the focal length f is set to 2.38 mm, the numerical aperture F is set to 2.8, the half viewing angle ω is set to 31.8 degrees, and the lens length H is set to 3.25 mm.

TABLE 3

| |
|---|
| f (focal length) = 2.38 mm |
| F (numerical aperture) = 2.8 |
| ω (half viewing angle) = 31.8 deg |
| H (total lens length) = 3.25 mm |

Table 4 shows that the conditional expression (1) is satisfied in Example 1.

TABLE 4

| Conditional expression (1) | 0.55 |
|---|---|

As shown in Table 4, the condition defined by the conditional expression (1) is satisfied in Example 1.

Figure 4:
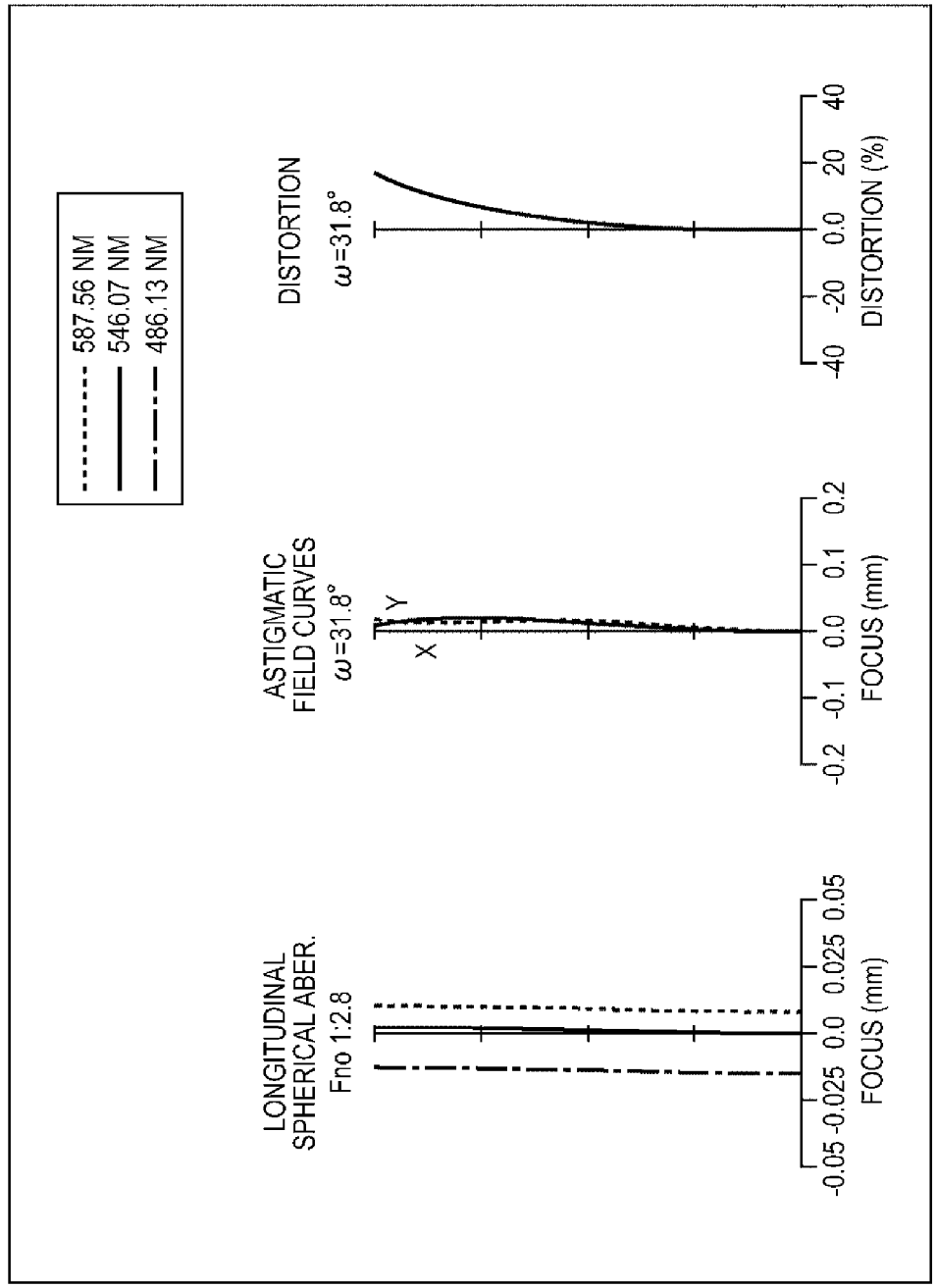
FIG. 4 is an aberration diagram showing a spherical aberration, astigmatism, and distortion in Example 1.

FIG. 4 is an aberration diagram showing a spherical aberration (chromatic aberration), astigmatism, and distortion in Example 1. The left portion of FIG. 4 shows the spherical aberration (chromatic aberration). The central portion of FIG. 4 shows the astigmatism. The right portion of FIG. 4 shows the distortion.

According to Example 1, an imaging apparatus including a lens having a total optical length of as compact as 3.25 mm and excellent imaging performance while having the following characteristics is provided: the spherical aberration, the astigmatism, and the distortion are well corrected as shown in FIG. 4; the numerical aperture is as large as 2.8; and the half viewing angle is as wide as 31.8 degrees.

Figure 5:
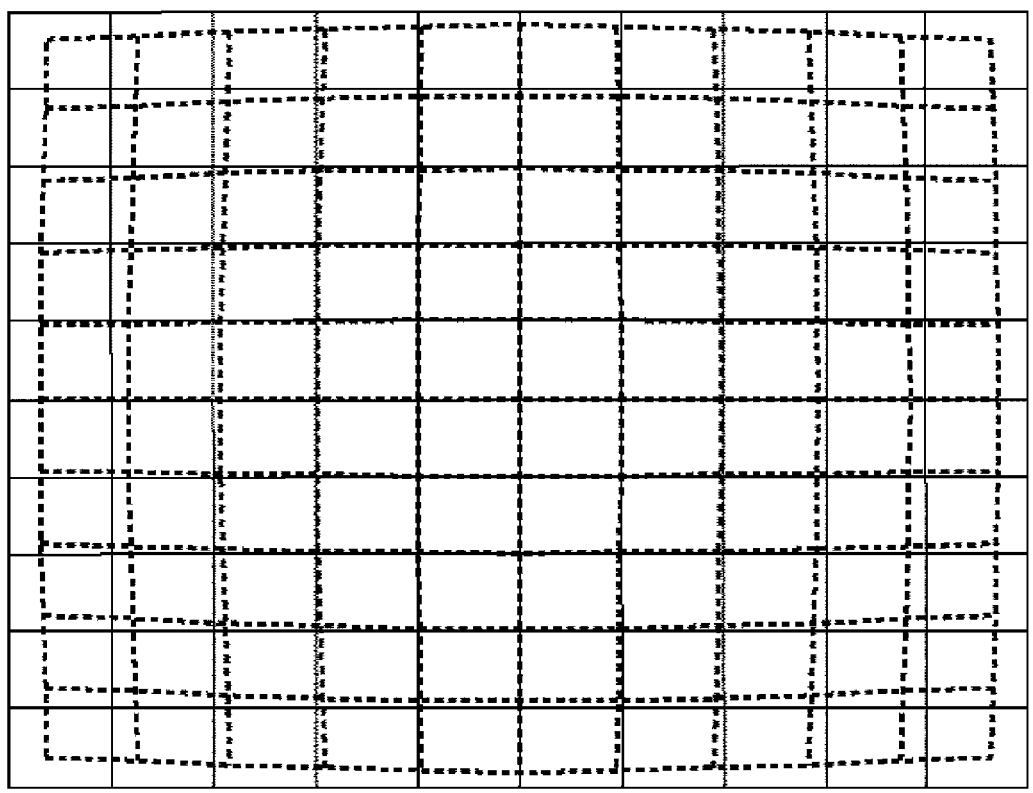
FIG. 5 shows a distortion lattice pattern in Example 1.

Further, in Example 1, the lens element 111 has large positive power and a focal length of 4.10 mm and the lens element 113 has small positive power and a focal length of 10.3 mm with a diaphragm interposed between the lens element 111 and the lens element 113. A positive (pincushion-shaped) optical distortion of 16.8% produced by the thus configured lens group 110 cancels large negative (barrel-shaped) optical distortion produced by the curved imaging device 130 and hence reduces optical distortion produced in the entire imaging apparatus to a small negative (barrel-shaped) optical distortion of 1.88% as shown in FIG. 5.

Example 2

Figure 6:
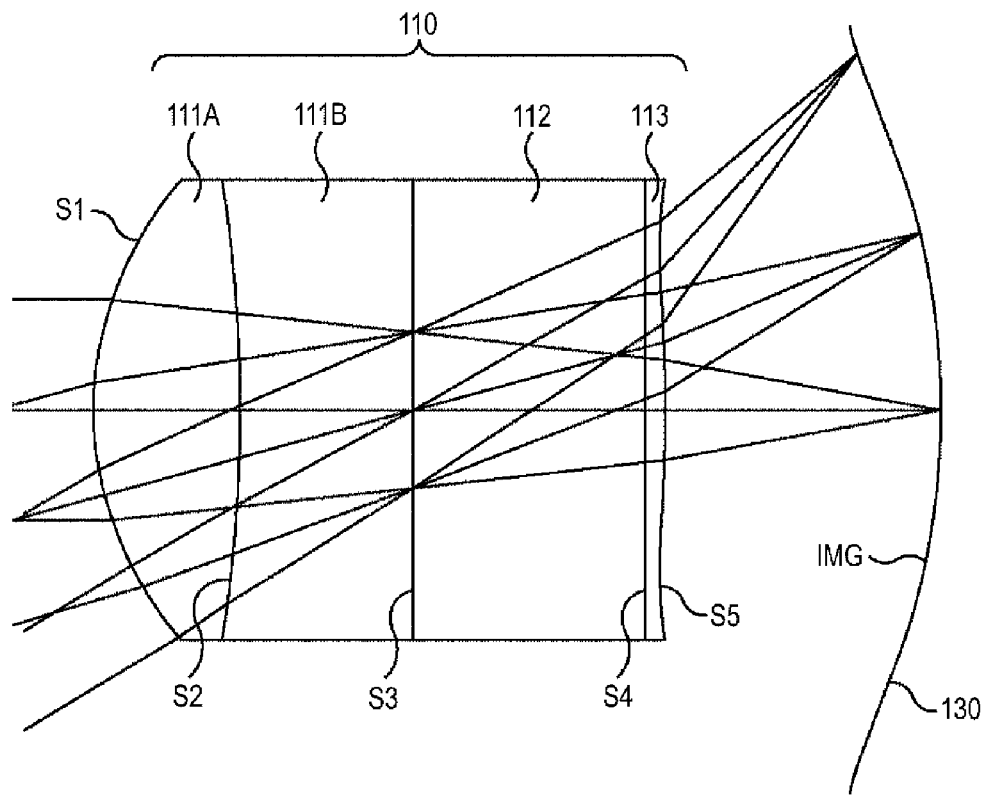
FIG. 6 shows an example of the configuration of an imaging apparatus according to Example 2.

FIG. 6 shows an example of the configuration of an imaging apparatus for a ⅙-size CMOS image sensor having 3-mega pixels arranged at 1.1-μm intervals.

The imaging apparatus shown in FIG. 6 is formed of a lens group 110 and an imaging device 130.

The lens group 110 is formed of a lens element 111A, a lens element 111B, a transparent member 112, and a lens element 113 sequentially arranged from the object side toward the light receiving surface of the imaging device 130 and boned to each other. The lens element 111A has a convex surface on both sides, and the lens element 111B has a plano-concave shape. The transparent member 112 has a diaphragm and an infrared removal filter.

The lens elements 111A and 111B are desirably formed in a replica method in which a UV curable resin is transferred onto the transparent member 112 and irradiated with UV light. Similarly, the lens element 113 is desirably formed in the replica method on the opposite side of the transparent member 112 to the surface on which the lens elements 111A and 111B have been formed. Specifically, the lens elements 111A and 111B can be formed, for example, by using an NT33 glass material and an NT57 glass material manufactured by NITTO DENKO CORPORATION and carrying out the replica process twice on a D263T glass substrate manufactured by SCHOTT AG. Further, the lens element 113 can be formed by using the NT33 glass material manufactured by NITTO DENKO CORPORATION on the opposite side of the D263T glass substrate manufactured by SCHOTT AG to the lens elements 111A and 111B.

The light receiving surface of the imaging device 130 is a curved surface having an aspheric shape and concave toward the lens group 110. In FIG. 6, the tangential angle is set to 21.2 degrees.

In FIG. 6, the surfaces of the lens element 111A, the lens element 111B, the transparent member 112, and the lens element 113, and the light receiving surface of the imaging device 130 are labeled with surface numbers S1, S2, S3, S4, S5, and IMG.

Table 5 shows the radius of curvature R (mm), the distance d (mm), the refractive index nd, and the dispersion nd associated with the surfaces corresponding to the surface numbers in the imaging apparatus shown in FIG. 6.

TABLE 5

| Surface number | R | d | nd | νd |
|---|---|---|---|---|
| S1 | 1.288 | 0.565 | 1.53 | 51.7 |
| S2 | −5.048 | 0.654 | 1.57 | 33.0 |
| S3 | INFINITY | 0.900 | 1.52 | 55.0 |
| S4 | INFINITY | 0.070 | 1.53 | 51.7 |
| S5 | −6.456 | 1.064 | | |
| IMG | −3.427 | 0.000 | | |

Table 6 shows the fourth, sixth, eighth, and tenth aspheric coefficients of aspheric surfaces in the imaging apparatus shown in FIG. 6, specifically, the surface S1 of the lens element 111A, the surface S5 of the lens element 113, and the light receiving surface IMG of the imaging device 130. In Table 6, K denotes the conic coefficient, A denotes the fourth aspheric coefficient; B denotes the sixth aspheric coefficient; C denotes the eighth aspheric coefficient; and D denotes the tenth aspheric coefficient.

TABLE 6

| Surface S1 | K: −0.442 | A: −0.458E−02 | B: 0.460E−01 | C: −0.580E−01 | D: 0.228E−01 |
| Surface S5 | K: −1.000 | A: 0.134E+00 | B: −0.123E+00 | C: 0.171E+00 | D: −0.775E−01 |
| Surface IMG | K: 1.000 | A: −0.190E−01 | B: −0.816E−02 | C: 0.128E−01 | D: −0.235E−02 |

Table 7 shows the focal length f, the numerical aperture F, the half viewing angle ω, the lens length H of the lens group 110 in the imaging apparatus shown in FIG. 6. In the example shown in FIG. 6, the focal length f is set to 2.37 mm, the numerical aperture F is set to 2.8, the half viewing angle

ω is set to 31.8 degrees, and the lens length H is set to 3.25 mm.

TABLE 7

| f (focal length) = 2.37 mm |
| F (numerical aperture) = 2.8 |
| ω (half viewing angle) = 31.8 deg |
| H (total lens length) = 3.25 mm |

Table 8 shows that the conditional expression (1) is satisfied in Example 2.

TABLE 8

| Conditional expression (1) | 0.55 |

As shown in Table 8, the condition defined by the conditional expression (1) is satisfied in Example 2.

Figure 7:
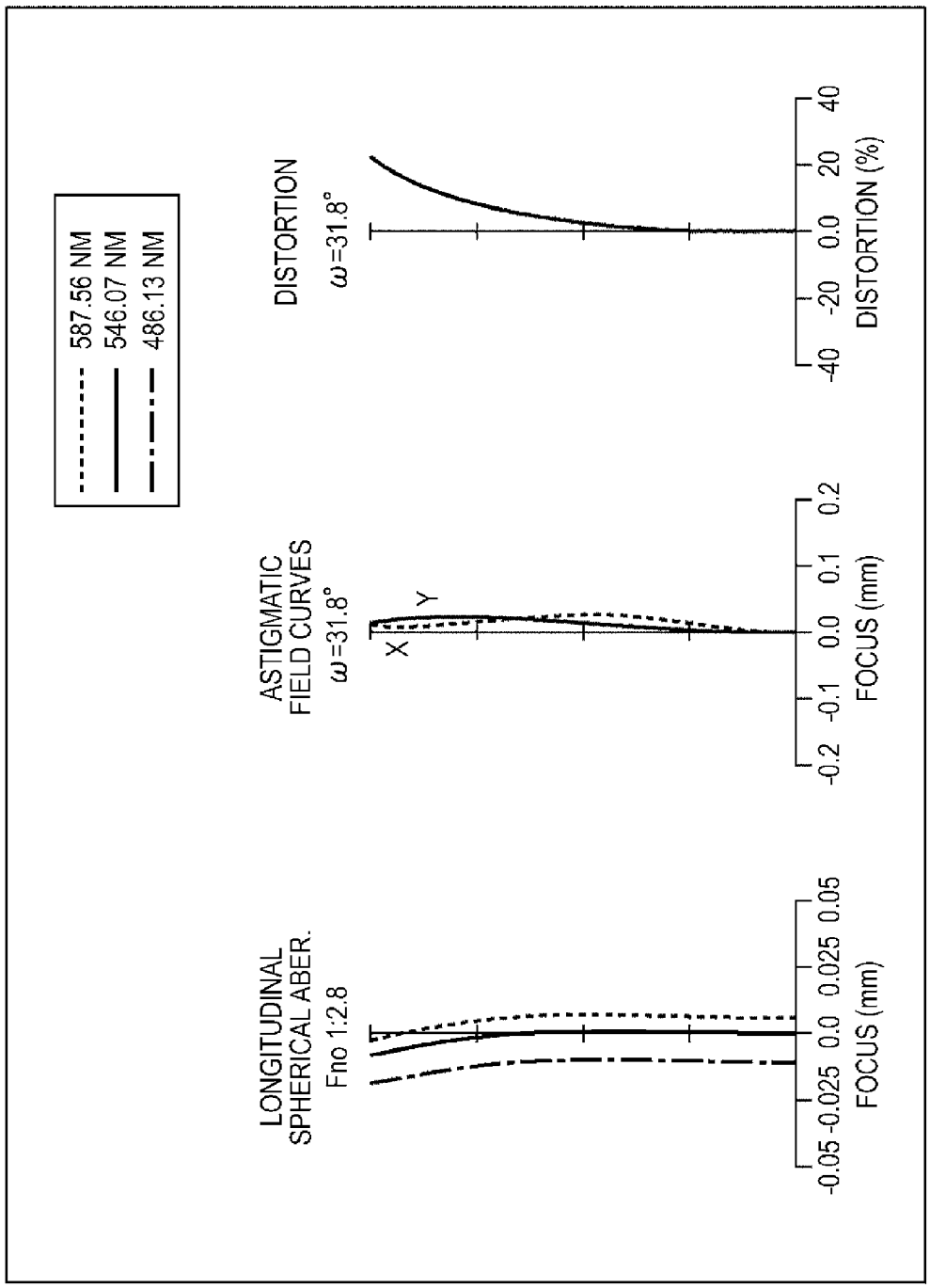
FIG. 7 is an aberration diagram showing a spherical aberration, astigmatism, and distortion in Example 2.

FIG. 7 is an aberration diagram showing a spherical aberration (chromatic aberration), astigmatism, and distortion in Example 2. The left portion of FIG. 7 shows the spherical aberration (chromatic aberration). The central portion of FIG. 7 shows the astigmatism. The right portion of FIG. 7 shows the distortion.

According to Example 2, an imaging apparatus including a lens having a total optical length of as compact as 3.25 mm and excellent imaging performance while having the following characteristics is provided: the spherical aberration, the astigmatism, and the distortion are well corrected as shown in FIG. 7; the numerical aperture is as large as 2.8; and the half viewing angle is as wide as 31.8 degrees.

Figure 8:
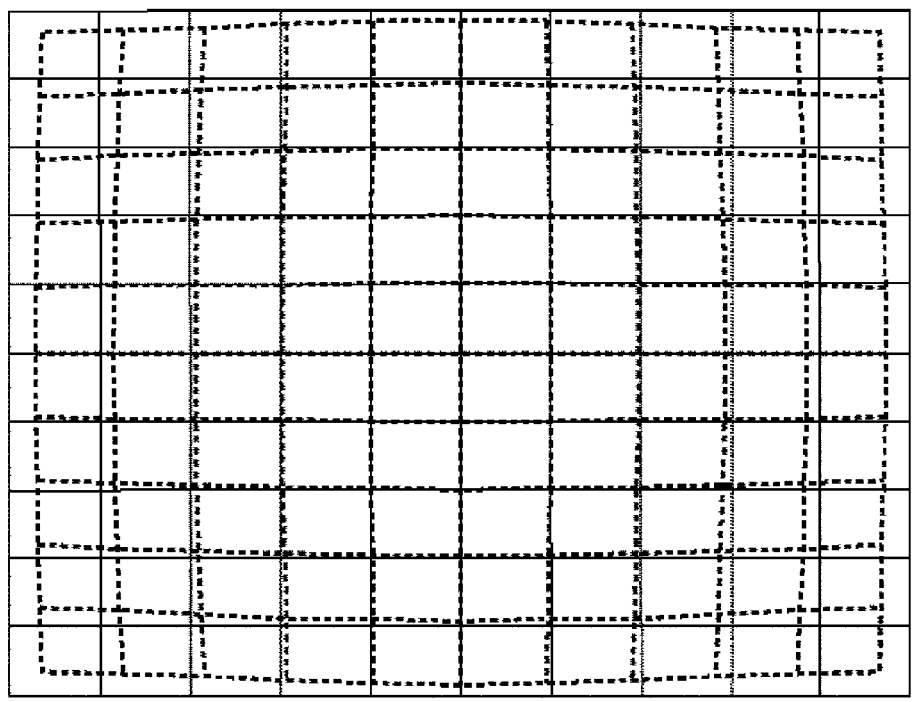
FIG. 8 shows a distortion lattice pattern in Example 2.

Further, in Example 2, the combination of lens elements 111A and 111B has large positive power and a focal length of 4.07 mm and the lens element 113 has very small positive power and a focal length of 12.6 mm with a diaphragm interposed between the lens elements 111 and the lens element 113. A positive (pincushion-shaped) optical distortion of 22.3% produced by the thus configured lens group 110 cancels large negative (barrel-shaped) optical distortion produced by the curved imaging device 130 and hence reduces optical distortion produced in the entire imaging apparatus to a small negative (barrel-shaped) optical distortion of 1.88% as shown in FIG. 8.

Example 3

Figure 9:
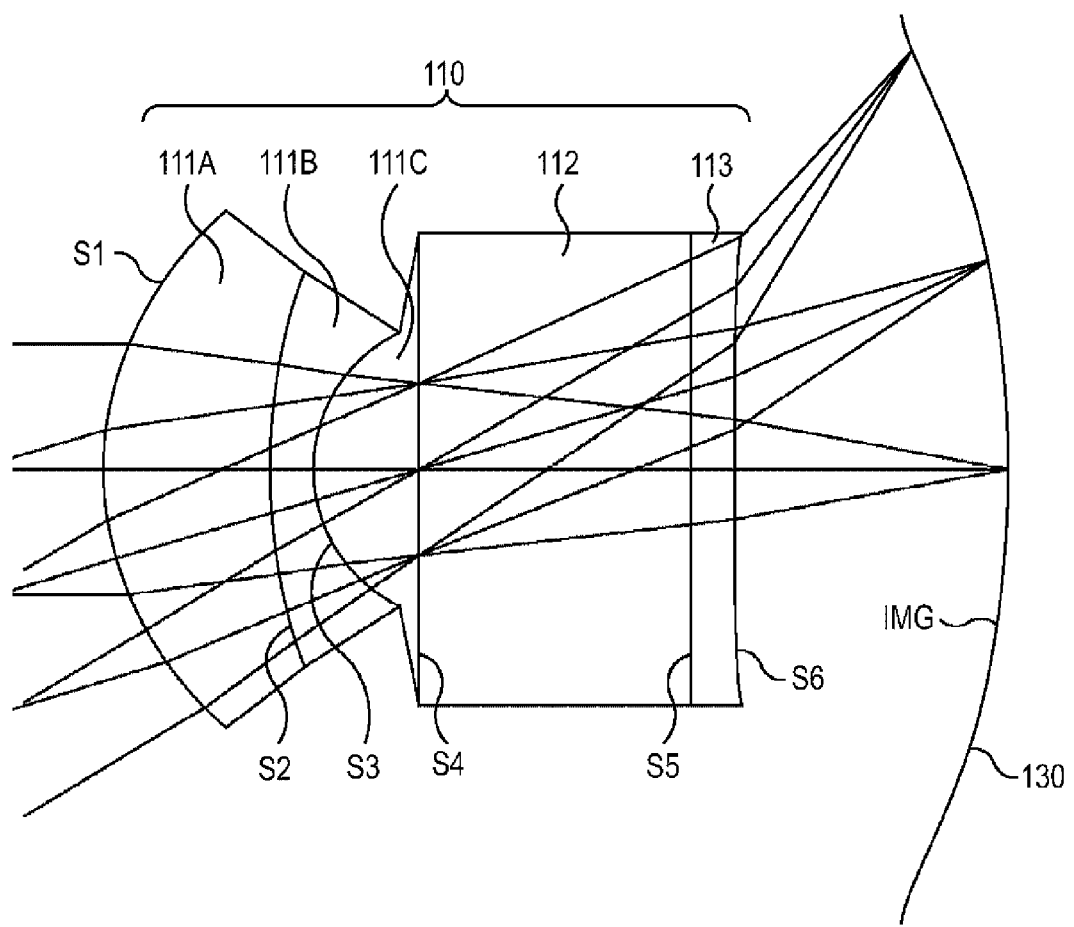
FIG. 9 shows an example of the configuration of an imaging apparatus according to Example 3.

FIG. 9 shows an example of the configuration of an imaging apparatus for a ⅙-size CMOS image sensor having 3-mega pixels arranged at
1.1-μm intervals.

The imaging apparatus shown in FIG. 9 is formed of a lens group 110 and an imaging device 130.

The lens group 110 is formed of a lens element 111A, a lens element 111B, a lens element 111C, a transparent member 112, and a lens element 113 sequentially arranged from the object side toward the light receiving surface of the imaging device 130 and boned to each other. The lens element 111A has a convex surface on both sides. The lens element 111B has a concave shape. The lens element 111C has a plano-convex shape. The transparent member 112 has a diaphragm and an infrared removal filter.

The lens elements 111A, 111B, and 111C are desirably formed in a replica method in which a UV curable resin is transferred onto the transparent member 112 and irradiated with UV light. Similarly, the lens element 113 is desirably formed in the replica method on the opposite side of the transparent member 112 to the surface on which the lens elements 111 have been formed. Specifically, the lens elements 111A, 111B, and 111C can be formed, for example, by using an NT33 glass material and an NT57 glass material manufactured by NITTO DENKO CORPORATION and carrying out the replica process three times on a D263T glass substrate manufactured by SCHOTT AG. Further, the lens element 113 can be formed by using the NT33 glass material manufactured by NITTO DENKO CORPORATION on the opposite surface of the D263T glass substrate manufactured by SCHOTT AG to the lens elements 111A, 111B, and 111C.

The light receiving surface of the imaging device 130 is a curved surface having an aspheric shape and concave toward the lens group 110. In FIG. 9, the tangential angle is set to 22.2 degrees.

In FIG. 9, the surfaces of the lens element 111A, the lens element 111B, the lens element 111C, the transparent member 112, and the lens element 113 and the light receiving surface of the imaging device 130 are labeled with surface numbers S1, S2, S3, S4, S5, S6, and IMG.

Table 9 shows the radius of curvature R (mm), the distance d (mm), the refractive index nd, and the dispersion vd associated with the surfaces corresponding to the surface numbers in the imaging apparatus shown in FIG. 9.

TABLE 9

| Surface number | R | d | nd | vd |
| --- | --- | --- | --- | --- |
| S1 | 1.041 | 0.551 | 1.53 | 51.7 |
| S2 | 1.961 | 0.142 | 1.57 | 33.0 |
| S3 | 0.495 | 0.347 | 1.53 | 51.7 |
| S4 | INFINITY | 0.900 | 1.52 | 55.0 |
| S5 | INFINITY | 0.150 | 1.53 | 51.7 |
| S6 | −14.65 | 0.902 | | |
| IMG | −3.412 | 0.000 | | |

Table 10 shows the fourth, sixth, eighth, and tenth aspheric coefficients of aspheric surfaces in the imaging apparatus shown in FIG. 9, specifically, the surface S1 of the lens element 111A, the surface S5 of the lens element 113, and the light receiving surface IMG of the imaging device 130. In Table 10, K denotes the conic coefficient, A denotes the fourth aspheric coefficient; B denotes the sixth aspheric coefficient; C denotes the eighth aspheric coefficient; and D denotes the tenth aspheric coefficient.

TABLE 10

| | | | | |
|---|---|---|---|---|
| Surface S1 | K: −0.442 | A: 0.306E−01 | B: 0.321E−01 | C: −0.277E−01 D: 0.204E−01 |
| Surface S5 | K: −1.000 | A: 0.122E+00 | B: 0.252E−01 | C: −0.872E−01 D: 0.674E−01 |
| Surface IMG | K: 1.000 | A: 0.191E−01 | B: −0.200E−01 | C: −0.594E−02 D: 0.524E−02 |

Table 11 shows the focal length f, the numerical aperture F, the half viewing angle ω, the lens length H of the lens group 110 in the imaging apparatus shown in FIG. 9. In the example shown in FIG. 9, the focal length f is set to 2.30 mm, the numerical aperture F is set to 2.8, the half viewing angle

ω is set to 31.3 degrees, and the lens length H is set to 2.99 mm.

TABLE 11

| | |
|---|---|
| f (focal length) = | 2.30 mm |
| F (numerical aperture) = | 2.8 |
| ω (half viewing angle) = | 31.3 deg |
| H (total lens length) = | 2.99 mm |

Table 12 shows that the conditional expression (1) is satisfied in Example 3.

TABLE 12

| | |
|---|---|
| Conditional expression (1) | 0.56 |

As shown in Table 12, the condition defined by the conditional expression (1) is satisfied in Example 3.

Figure 10:
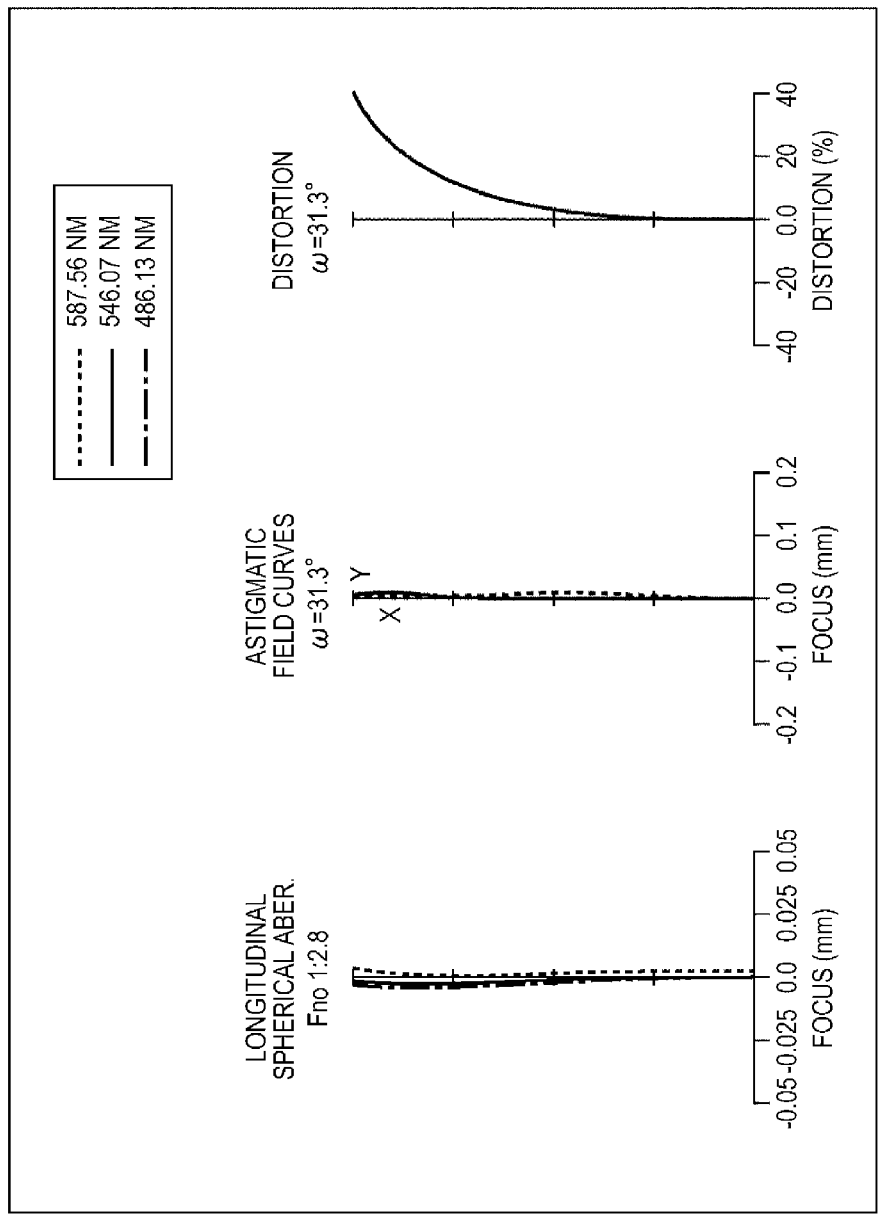
FIG. 10 is an aberration diagram showing a spherical aberration, astigmatism, and distortion in Example 3.

FIG. 10 is an aberration diagram showing a spherical aberration (chromatic aberration), astigmatism, and distortion in Example 3. The left portion of FIG. 10 shows the spherical aberration (chromatic aberration). The central portion of FIG. 10 shows the astigmatism. The right portion of FIG. 10 shows the distortion.

According to Example 3, an imaging apparatus including a lens having a total optical length of as compact as 2.99 mm and excellent imaging performance while having the following characteristics is provided: the spherical aberration, the astigmatism, and the distortion are well corrected as shown in FIG. 10; the numerical aperture is as large as 2.8; and the half viewing angle is as wide as 31.3 degrees.

Figure 11:
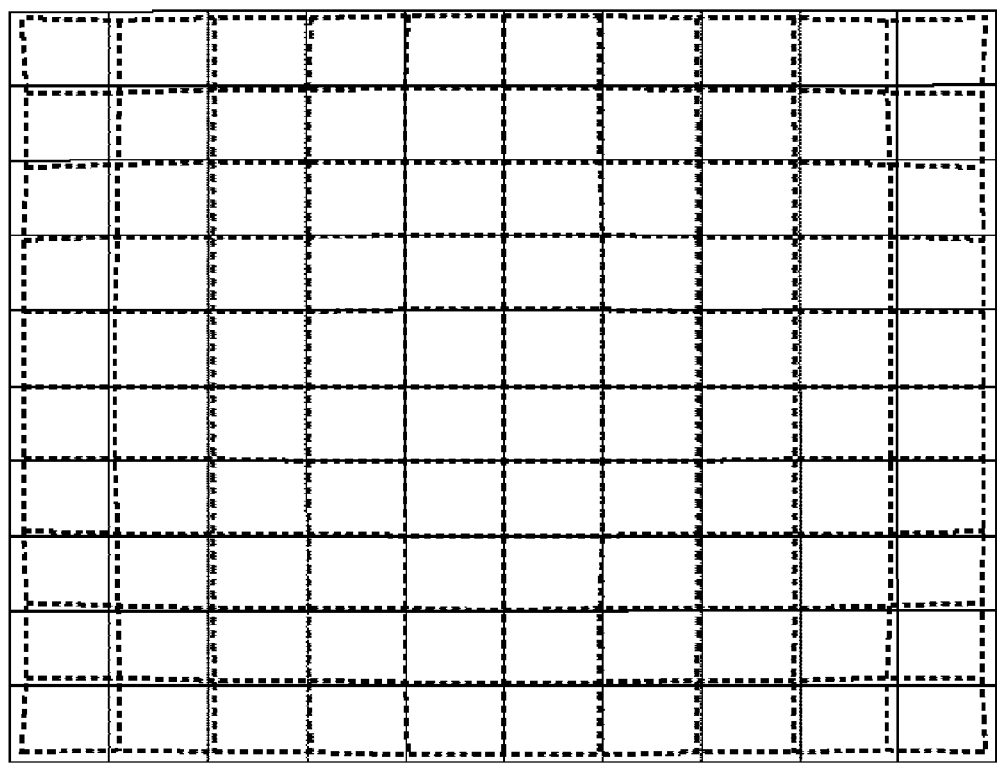
FIG. 11 shows a distortion lattice pattern in Example 3.

Further, in Example 3, the combination of the lens elements 111A, 111B, and 111C has large positive power and a focal length of 3.59 mm and the lens element 113 has very small positive power and a focal length of 28.6 mm with a diaphragm interposed between the lens elements 111 and the lens element 113. A positive (pincushion-shaped) optical distortion of 40.6% produced by the thus configured lens group 110 cancels large negative (barrel-shaped) optical distortion produced by the curved imaging device 130 and hence reduces optical distortion produced in the entire imaging apparatus to a small negative (barrel-shaped) optical distortion of 0.30% as shown in FIG. 11.

In the imaging apparatus having a one-group-design optical system described above, the tangential angle at the edge of the light receiving surface of the imaging device is set to a small value. In an imaging apparatus having a two-group-design optical system, the tangential angle can be further reduced.

In the following sections, a description will be made of the configuration of an embodiment of an imaging apparatus having a two-group-design optical system to which the present technology is applied.

2. Second Embodiment

Figure 12:
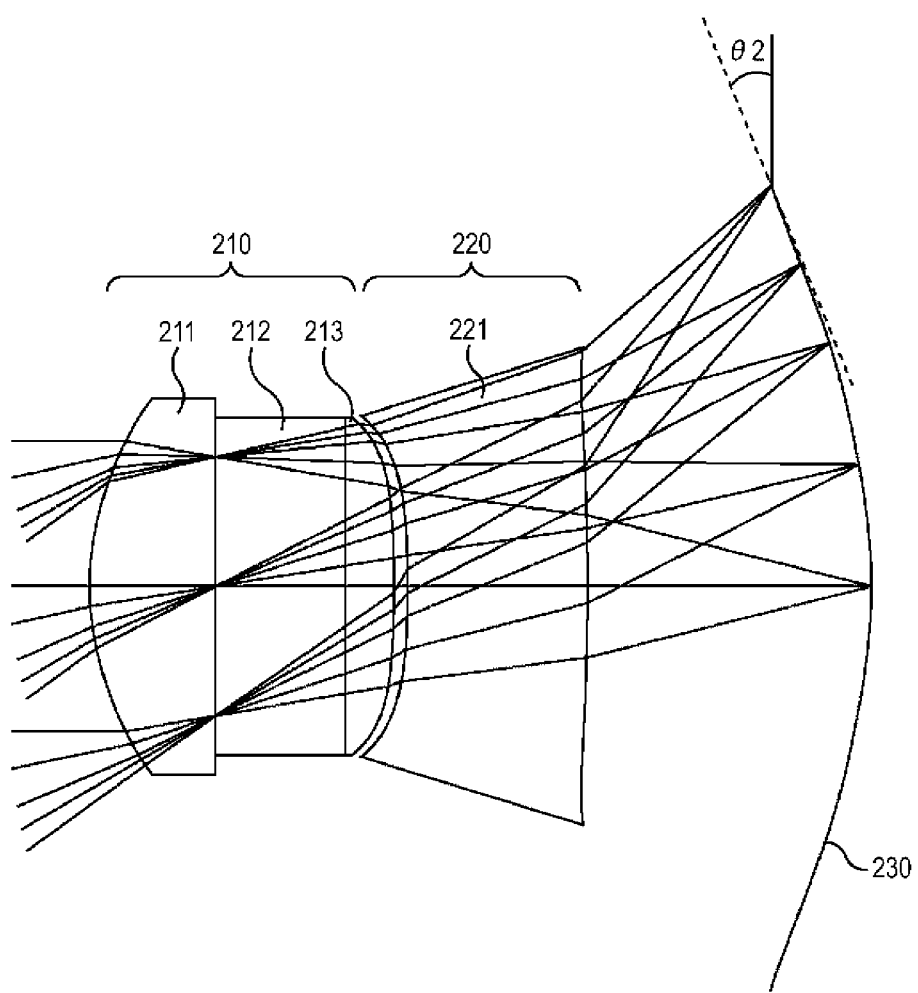
FIG. 12 shows an example of the configuration of an imaging apparatus according to a second embodiment to which the present technology is applied.

FIG. 12 shows an example of the configuration of an imaging apparatus according to a second embodiment to which the present technology is applied.

The imaging apparatus shown in FIG. 12 is formed of a first lens group 210 and a second lens group 220 as lens groups (hereinafter simply referred to as lens group 210 and lens group 220, respectively) and an imaging device 230. The imaging apparatus shown in FIG. 12 is also incorporated in a small electronic system, such as a mobile phone and a mobile PC.

Each of the lens group 210 and the lens group 220 is configured as a fixed-focal-length lens. The lens group 210 is an in-lens-diaphragm lens and located on the object side of the lens group 220. The lens group 210 is formed of a lens element 211, a transparent member 212, and a lens element 213 sequentially arranged from the object side toward the light receiving surface of the imaging device 230. The lens group 220 is formed of a lens element 221, and at least one of the two surfaces thereof has an aspheric shape. The lens element 211 has an object-side surface that is convex toward an object, and the transparent member 212 has a diaphragm and an infrared removal filter. The two surfaces of the lens element 221 are convex toward the light receiving surface. Further, the lens elements 211 and 213 are desirably formed in a replica method in which a UV curable resin is transferred onto the transparent member 212 and irradiated with UV light.

Each of the lens elements 211 and 213 may alternatively have a doublet configuration in which the lenses therein are made of two different glass materials and formed in two separate processes, a triplet configuration in which the lenses therein are made of three different glass materials and formed in in three separate processes, or a configuration in which the lenses therein are made of four or more different glass materials and formed in four or more separate processes.

Further, in a lens element 211 having a triplet configuration, a second lens may be replaced with air to form a configuration similar to three-group design, and in addition to the change described above, the transparent member 212 having a diaphragm is replaced only with a diaphragm to form a configuration similar to four-group design. The same optical characteristics as those provided in the present embodiment can be maintained in the above variations.

Figure 13A:
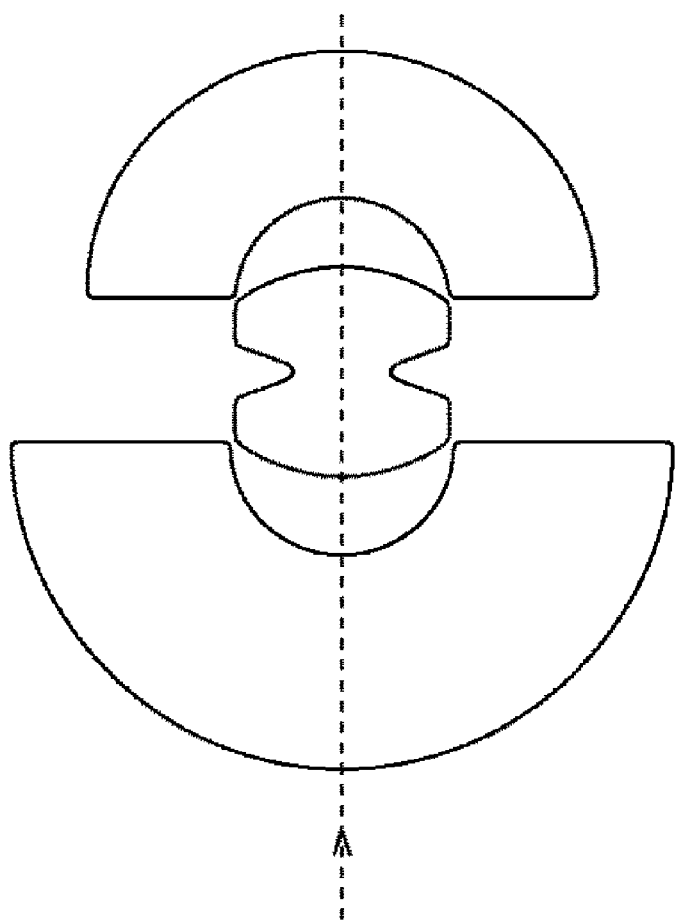
FIG. 13A describes a diaphragm in a lens of related art.
Figure 13B:
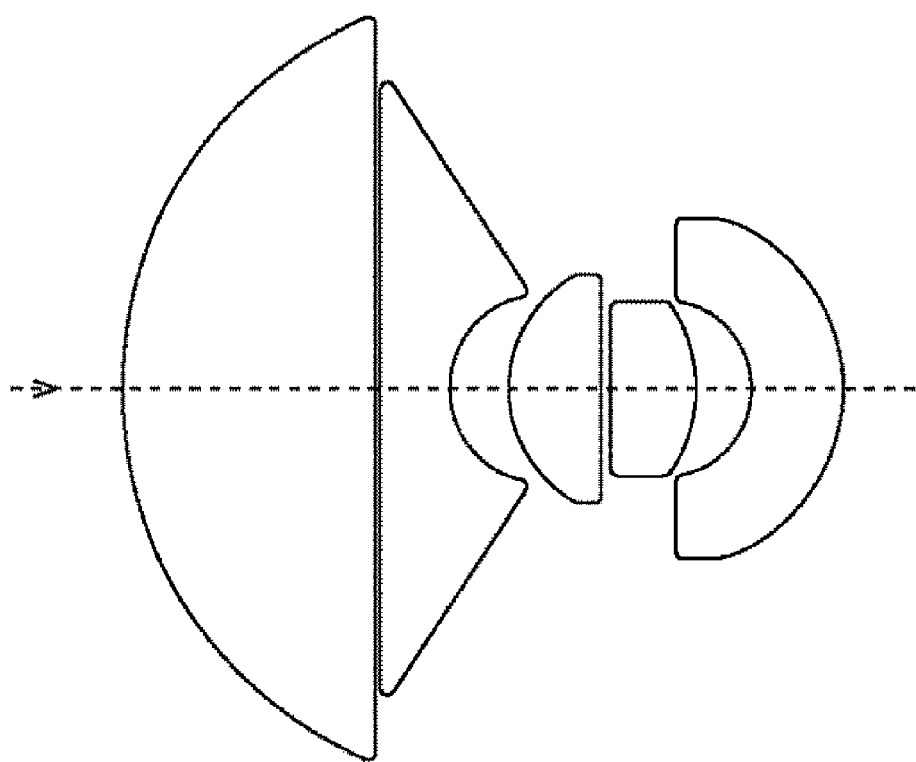
FIG. 13B describes a diaphragm in another lens of related art.

The variations are seen in the transition of Hologon manufactured by CARL ZEISS AG, and it is known that a configuration in which a diaphragm is provided in a central portion of a three-group-design lens as shown in FIG. 13A does not differ in optical characteristics from a configuration in which divided diaphragms are provided as shown in FIG. 13B.

Further, although not shown, a cover glass plate, an infrared removal filter, a low-pass filter, and other optical members each of which is made of a resin or glass material may further be disposed on the object side of the lens group 210 or between the lens group 220 and the imaging device 230.

The imaging device 230 is formed, for example, of a CCD image sensor or a CMOS image sensor, and the light receiving surface thereof is so disposed that it coincides with an image formation plane of the combination of the lens groups 210 and 220. Further, the light receiving surface of the imaging device 230 is a curved surface having an aspheric shape and concave toward the lens groups 210 and 220.

A tangential angle
θ2
at the edge (outermost circumferential portion) of the light receiving surface of the imaging device 230 is further smaller than the tangential angle
θ1
at the edge of the light receiving surface of the imaging device 130 shown in FIG. 2 and set, for example, to 16.7 degrees. The smaller tangential angle
θ2
is achieved by the fact that the optical path of light passing through the lens group 220 is longer in a portion thereof farther away from the optical axis so that the image plane corresponding to the optical path is corrected by a greater amount.

The intersection of the normal to the tangential line that circumscribes the light receiving surface of the imaging device 230 at 100% of the image height and the optical axis of the lens groups 210 and 220 is farther away from the light receiving surface of the imaging device 230 than the intersection of the normal to the tangential line that circumscribes the light receiving surface at 0 to 90% of the image height and the optical axis.

Since the tangential angle can be further reduced as described above and hence the depth of the curve can be reduced, the imaging device can be readily curved, and breakage resulting from a large force acting on the boundary between the curved portion and the flat portion will not occur. The imaging apparatus itself can therefore be more reliably reduced in size.

The lens groups 210 and 220, each of which is a fixed-focal-length lens in the present embodiment, are configured to satisfy not only the conditional expression (1) described above but also the following conditional expressions (2) and (3).

First, the conditional expression (2) defines the power of the lens group 210.

$$0.5 \leq fg1/fg \leq 5 \quad (2)$$

In the conditional expression (2), fg denotes the focal length of the entire optical system (lens group 210 and lens group 220 as a whole), and fg1 denotes the focal length of the lens group 210. The conditional expression (2) is necessary from the following reason.

As fg1/fg increases, the amount of positive (pincushion-shaped) optical distortion produced by the lens group 210 decreases but optical distortion produced by the entire optical system increases. Further, as fg1/fg increases, the curvature of the light-incident-side first surface on the object side decreases. In this case, light rays having different image heights are incident on the light-incident-side first surface on the object side at different angles of incidence, resulting in a chromatic aberration. Since the optical characteristics become less desirable as fg1/fg becomes greater as described above, it is necessary to set an upper limit.

On the other hand, as fg1/fg decreases, the curvature of the light-incident-side first surface on the object side increases, and the first surface may have a non-manufacturable shape. It is therefore necessary to set a lower limit.

Second, the conditional expression (3) defines the power of the lens group 220.

$$2 \leq fg2/fg \text{ or } fg2/fg \leq -2 \quad (3)$$

In the conditional expression (3), fg2 denotes the focal length of the lens group 220. The conditional expression (3) is necessary from the following reason.

When fg2/fg becomes greater than −2, light rays having high image heights are lifted and hence incident on the imaging device 230 at large angles of incidence. In this case, desirable camera characteristics are not provided. It is therefore necessary to set the upper limit of −2. Further, when fg2/fg becomes smaller than 2, the states of the light rays having high image heights approach telecentric states, which typically require the position of the diaphragm to be shifted toward the object side. In this case, the symmetry of the optical system is not maintained and aberrations are not corrected. Desirable camera characteristics are not provided in this case as well. It is therefore necessary to set the lower limit of 2.

The shape of an aspheric surface of a fixed-focal-length lens is expressed by the aspheric surface equation described above also in the present embodiment.

In the following sections, a description will be made of specific examples of the imaging apparatus according to the second embodiment described above.

Example 4

Figure 14:
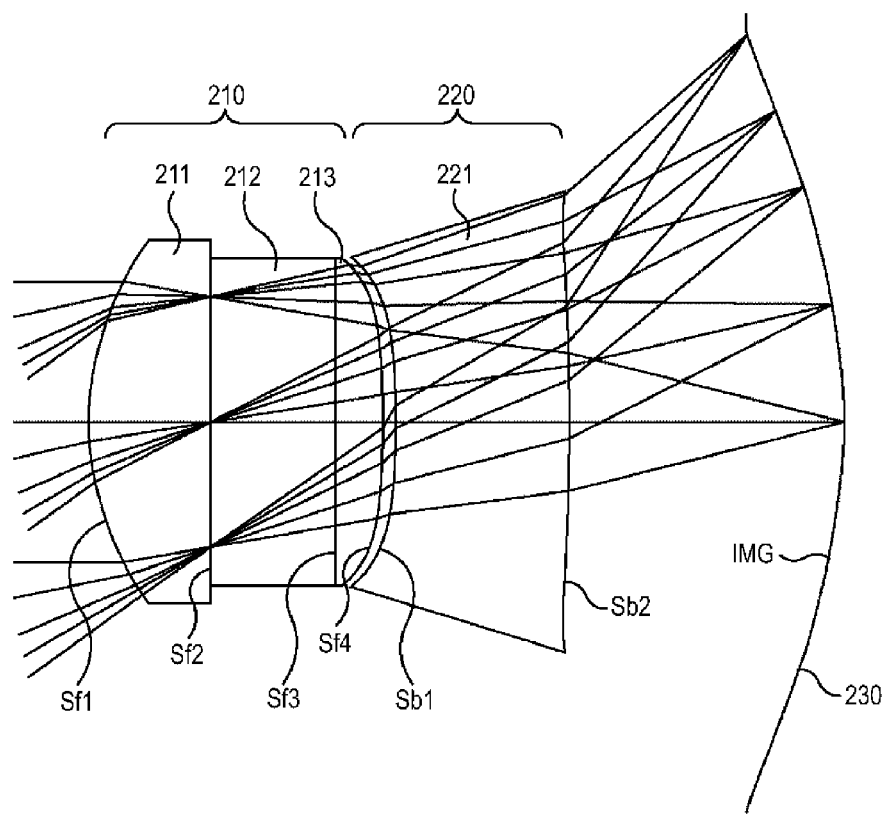
FIG. 14 shows an example of the configuration of an imaging apparatus according to Example 4.

FIG. 14 shows an example of the configuration of an imaging apparatus for a ⅕-size CMOS image sensor having 5-mega pixels arranged at 1.1-μm intervals.

The imaging apparatus shown in FIG. 14 is formed of a lens group 210, a lens group 220, and an imaging device 230.

The lens group 210 is formed of a lens element 211, a transparent member 212, and a lens element 213 sequentially arranged from the object side toward the light receiving surface of the imaging device 230 and boned to each other. The lens group 220 is formed of a lens element 221. The lens element 211 has an object-side surface that is convex toward an object, and the transparent member 212 has a diaphragm and an infrared removal filter. The two surfaces of the lens element 221 are convex toward the light receiving surface.

The lens element 211 is desirably formed in a replica method in which a UV curable resin is transferred onto the transparent member 212 and irradiated with UV light. Similarly, the lens element 213 is desirably formed in the replica method on the opposite side of the transparent member 212 to the side on which the lens element 211 has been formed. The lens element 221 is desirably formed as a glass molded lens. Specifically, the lens elements 211 and 213 can be formed, for example, by using an NT33 glass material manufactured by NITTO DENKO CORPORATION on opposite sides of a D263T glass substrate manufactured by SCHOTT AG. The lens element 221 can be formed as a glass molded lens by using a p-SK57 glass material manufactured by SCHOTT AG.

The light receiving surface of the imaging device 230 is a curved surface having an aspheric shape and concave toward the lens groups 210 and 220. In FIG. 14, the tangential angle is set to 21.9 degrees.

In FIG. 14, the surfaces of the lens element 211, the transparent member 212, the lens element 213, and the lens element 221, and the light receiving surface of the imaging device 230 are labeled with surface numbers Sf1, Sf2, Sf3, Sf4, Sb1, Sb2, and IMG.

Table 13 shows the radius of curvature R (mm), the distance d (mm), the refractive index nd, and the dispersion vd
associated with the surfaces corresponding to the surface numbers in the imaging apparatus shown in FIG. 14.

TABLE 13

| Surface number | R | d | nd | vd |
|---|---|---|---|---|
| Sf1 | 1.32 | 0.561 | 1.51 | 57.3 |
| Sf2 | INFINITY | 0.572 | 1.52 | 55.0 |
| Sf3 | INFINITY | 0.218 | 1.51 | 57.3 |
| Sf4 | −6.983 | 0.060 | | |
| Sb1 | −4.663 | 0.800 | 1.76 | 27.6 |
| Sb2 | −7.057 | 1.258 | | |
| IMG | −2.613 | | | |

Table 14 shows the fourth, sixth, eighth, and tenth aspheric coefficients of aspheric surfaces in the imaging apparatus shown in FIG. 14, specifically, the surface Sf1 of the lens element 211, the surface Sf4 of the lens element 213, the surfaces Sb1 and Sb2 of the lens element 221, and the light receiving surface IMG of the imaging device 230. In Table 14, K denotes the conic coefficient, A denotes the fourth aspheric coefficient; B denotes the sixth aspheric coefficient; C denotes the eighth aspheric coefficient; and D denotes the tenth aspheric coefficient.

TABLE 14

| Surface Sf1 | K: −0.728 | A: 0.306E−01 | B: −0.1341E−01 | C: 0.127E−01 | D: −0.154E−01 |
|---|---|---|---|---|---|
| Surface Sf4 | K: −1.000 | A: −0.248E+00 | B: 0.257E+00 | C: −0.228E+01 | D: 0.197E+01 |
| Surface Sb1 | K: 0.196 | A: −0.232E+00 | B: 0.205E+00 | C: −0.163E+01 | D: 0.846E+00 |
| Surface Sb2 | K: 0.412 | A: 0.319E−01 | B: 0.219E−01 | C: −0.167E−01 | D: 0.685E−02 |
| Surface IMG | K: −5.00 | A: 0.0 | B: 0.0 | C: 0.0 | D: 0.0 |

Table 15 shows the focal length f, the numerical aperture F, the half viewing angle ω,
the lens length H of the entire optical system (lens group 210 and lens group 220) in the imaging apparatus shown in FIG. 14. In the example shown in FIG. 14, the focal length f is set to 2.60 mm, the numerical aperture F is set to 2.05, the half viewing angle
ω
is set to 35.4 degrees, and the lens length H is set to 3.47 mm.

TABLE 15

| f (focal length) = | 2.60 mm |
|---|---|
| F (numerical aperture) = | 2.05 |
| ω (half viewing angle) = | 35.4 deg |
| H (total lens length) = | 3.47 mm |

Table 16 shows that the conditional expressions (1) to (3) are satisfied in Example 4.

TABLE 16

| Conditional expression (1) | 0.59 |
|---|---|
| Conditional expression (2) | 0.88 |
| Conditional expression (3) | −8.12 |

As shown in Table 16, the conditions defined by the conditional expressions (1) to (3) are satisfied in Example 4.

Figure 15:
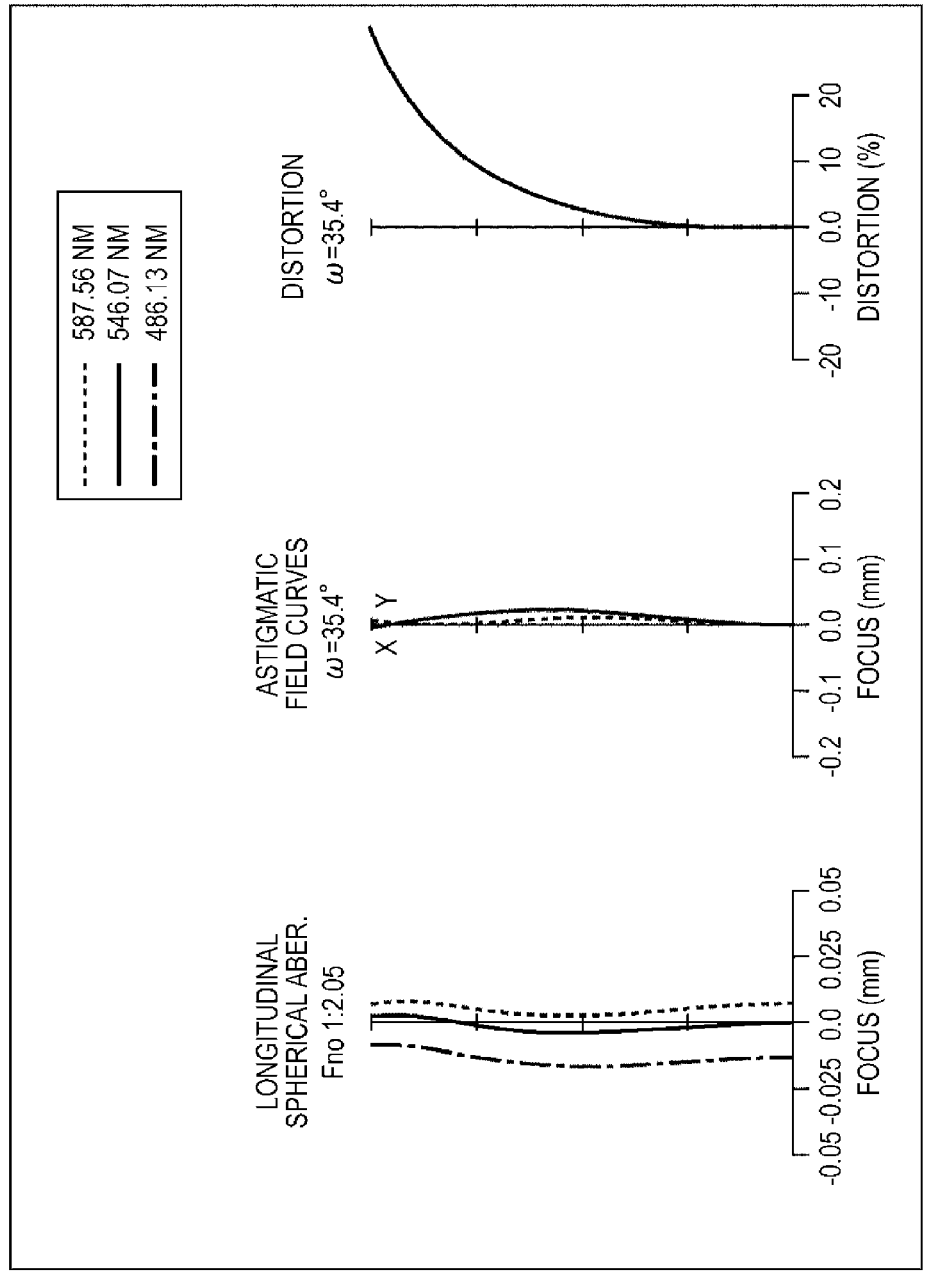
FIG. 15 is an aberration diagram showing a spherical aberration, astigmatism, and distortion in Example 4.

FIG. 15 is an aberration diagram showing a spherical aberration (chromatic aberration), astigmatism, and distortion in Example 4. The left portion of FIG. 15 shows the spherical aberration (chromatic aberration). The central portion of FIG. 15 shows the astigmatism. The right portion of FIG. 15 shows the distortion.

According to Example 4, an imaging apparatus including a lens having a total optical length of as compact as 3.47 mm and excellent imaging performance while having the following characteristics is provided: the spherical aberration, the astigmatism, and the distortion are well corrected as shown in FIG. 15; the numerical aperture is as large as 2.05; and the half viewing angle is as wide as 35.4 degrees.

Figure 16:
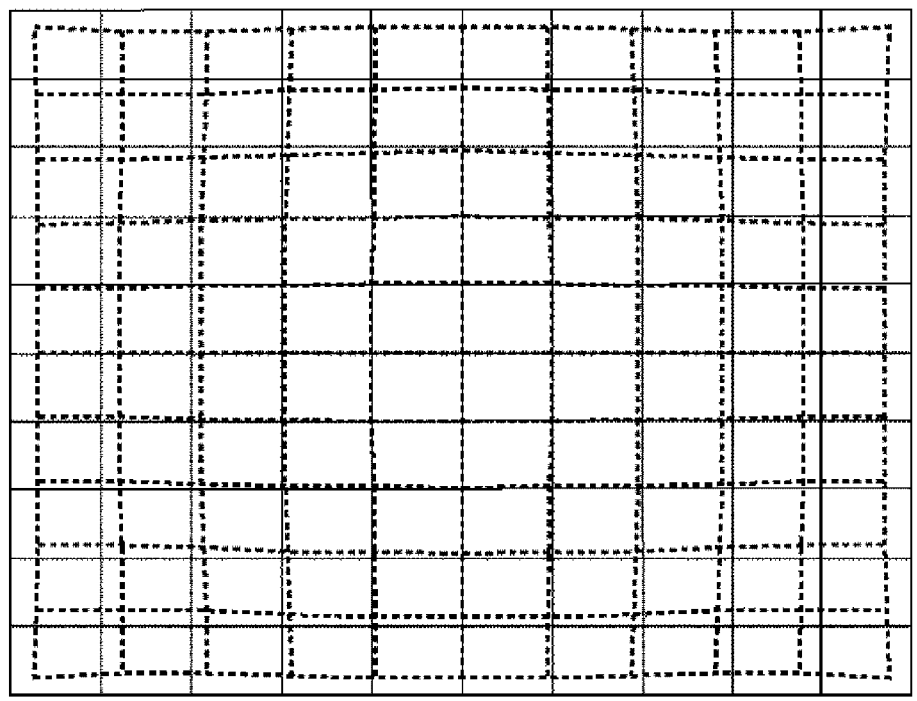
FIG. 16 shows a distortion lattice pattern in Example 4.

Further, in Example 4, the lens group 210 has large positive power and a focal length of 2.30 mm and the lens group 220 has small negative power and a focal length of 21.1 mm. A positive (pincushion-shaped) optical distortion of 30.2% produced by the thus configured lens groups 210 and 220 cancels large negative (barrel-shaped) optical distortion produced by the curved imaging device 230 and hence reduces optical distortion produced in the entire imaging apparatus to a small negative (barrel-shaped) optical distortion of 0.13% as shown in FIG. 16.

Example 5

Figure 17:
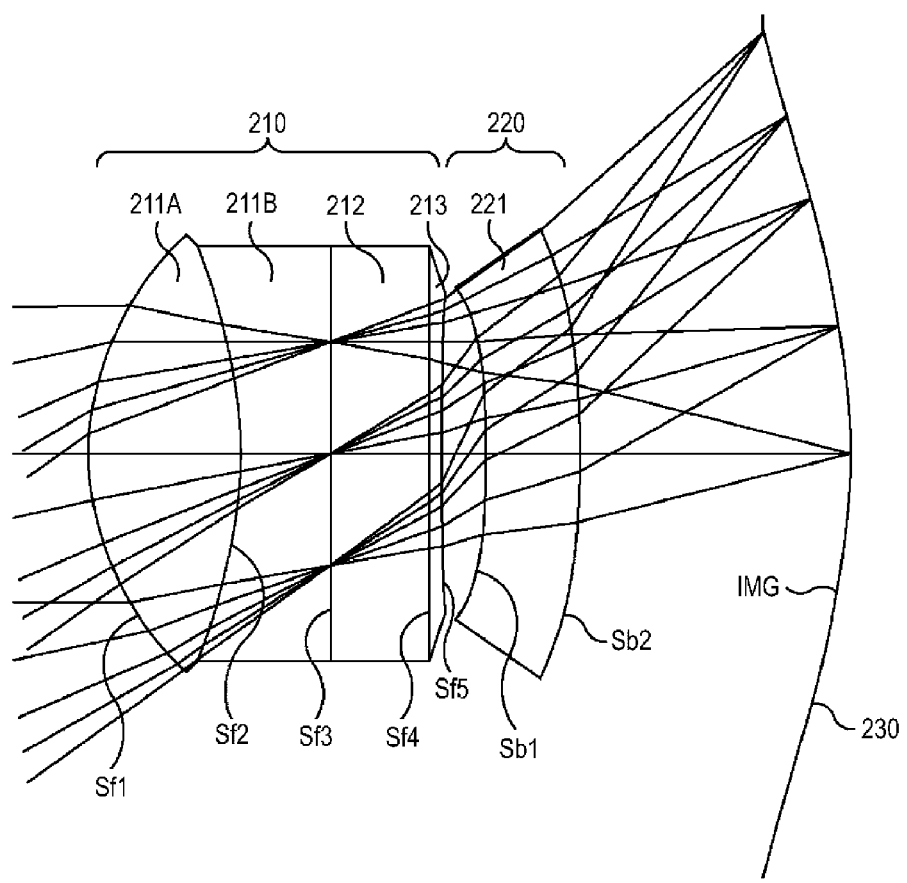
FIG. 17 shows an example of the configuration of an imaging apparatus according to Example 5.

FIG. 17 shows an example of the configuration of an imaging apparatus for a ⅕-size CMOS image sensor having 5-mega pixels arranged at
1.1-μm intervals.

The imaging apparatus shown in FIG. 17 is formed of a lens group 210, a lens group 220, and an imaging device 230.

The lens group 210 is formed of a lens element 211A, a lens element 211B, a transparent member 212, and a lens element 213 sequentially arranged from the object side toward the light receiving surface of the imaging device 230 and boned to each other. The lens group 220 is formed of a lens element 221. The lens element 211A has an object-side surface that is convex toward an object, and the transparent member 212 has a diaphragm and an infrared removal filter. The two surfaces of the lens element 221 are convex toward the light receiving surface.

The lens elements 211A and 211B are desirably formed in a replica method in which a UV curable resin is transferred onto the transparent member 212 and irradiated with UV light. Similarly, the lens element 213 is desirably formed in the replica method on the opposite side of the transparent member 212 to the surface on which the lens element 211B has been formed. The lens element 221 is desirably formed as a glass molded lens. Specifically, the lens elements 211A and 211B can be formed, for example, by using an NT33 glass material and an NT57 glass material manufactured by NITTO DENKO CORPORATION on a D263T glass substrate manufactured by SCHOTT AG in the replica process carried out twice. The lens element 213 can be formed by using the NT33 glass material manufactured by NITTO DENKO CORPORATION on the opposite side of the D263T glass substrate manufactured by SCHOTT AG to the lens elements 211A and 211B. Further, the lens element 221 can be formed as a glass molded lens by using a p-SK57 glass material manufactured by SCHOTT AG.

The light receiving surface of the imaging device 230 is a curved surface having an aspheric shape and concave toward the lens groups 210 and 220. In FIG. 17, the tangential angle is set to 16.7 degrees.

In FIG. 17, the surfaces of the lens element 211A, the lens element 211B, the transparent member 212, the lens element 213, and the lens element 221, and the light receiving surface of the imaging device 230 are labeled with surface numbers Sf1, Sf2, Sf3, Sf4, Sf5, Sb1, Sb2, and IMG.

Table 17 shows the radius of curvature R (mm), the distance d (mm), the refractive index nd, and the dispersion vd associated with the surfaces corresponding to the surface numbers in the imaging apparatus shown in FIG. 17.

TABLE 17

| Surface number | R | d | nd | vd |
|---|---|---|---|---|
| Sf1 | 1.197 | 0.641 | 1.51 | 57.3 |
| Sf2 | −1.849 | 0.383 | 1.57 | 33.0 |
| Sf3 | INFINITY | 0.418 | 1.52 | 55.0 |
| Sf4 | INFINITY | 0.049 | 1.51 | 57.3 |
| Sf5 | 27.74 | 0.186 | | |
| Sb1 | −4.737 | 0.400 | 1.58 | 59.4 |
| Sb2 | −3.734 | 1.140 | | |
| IMG | −2.576 | | | |

Table 18 shows the fourth, sixth, eighth, and tenth aspheric coefficients of aspheric surfaces in the imaging apparatus shown in FIG. 15, specifically, the surface Sf1 of the lens element 211A, the surface Sf2 of the lens element 211B, the surface Sf5 of the lens element 213, the surfaces Sb1 and Sb2 of the lens element 221, and the light receiving surface IMG of the imaging device 230. In Table 18, K denotes the conic coefficient, A denotes the fourth aspheric coefficient; B denotes the sixth aspheric coefficient; C denotes the eighth aspheric coefficient; and D denotes the tenth aspheric coefficient.

TABLE 18

| Surface Sf1 | K: −0.822 | A: 0.498E−01 | B: 0.272E−02 | C: 0.361E−01 | D: −0.254E−01 |
| Surface Sf2 | K: −0.987 | A: −0.338E−01 | B: 0.216E+00 | C: −0.217E+00 | D: 0.788E−01 |
| Surface Sf5 | K: −0.695 | A: 0.910E−02 | B: 0.438E−01 | C: −0.180E+00 | D: 0.294E+00 |
| Surface Sb1 | K: −0.989 | A: −0.188E+00 | B: 0.590E−01 | C: −0.265E+00 | D: −0.280E+00 |
| Surface Sb2 | K: 0.255 | A: −0.450E−01 | B: 0.245E−01 | C: −0.101E+00 | D: 0.639E−01 |
| Surface IMG | K: −10.00 | A: 0.0 | B: 0.0 | C: 0.0 | D: 0.0 |

Table 19 shows the focal length f, the numerical aperture F, the half viewing angle ω, the lens length H of the entire optical system (lens group 210 and lens group 220) in the imaging apparatus shown in FIG. 17. In the example shown in FIG. 17, the focal length f is set to 2.54 mm, the numerical aperture F is set to 2.05, the half viewing angle ω is set to 35.2 degrees, and the lens length H is set to 3.22 mm.

TABLE 19

| f (focal length) = | 2.54 mm |
|---|---|
| F (numerical aperture) = | 2.05 |
| ω (half viewing angle) = | 35.2 deg |
| H (total lens length) = | 3.22 mm |

Table 20 shows that the conditional expressions (1) to (3) are satisfied in Example 5.

TABLE 20

| Conditional expression (1) | 0.53 |
|---|---|
| Conditional expression (2) | 1.01 |
| Conditional expression (3) | 10.35 |

As shown in Table 20, the conditions defined by the conditional expressions (1) to (3) are satisfied in Example 5.

Figure 18:
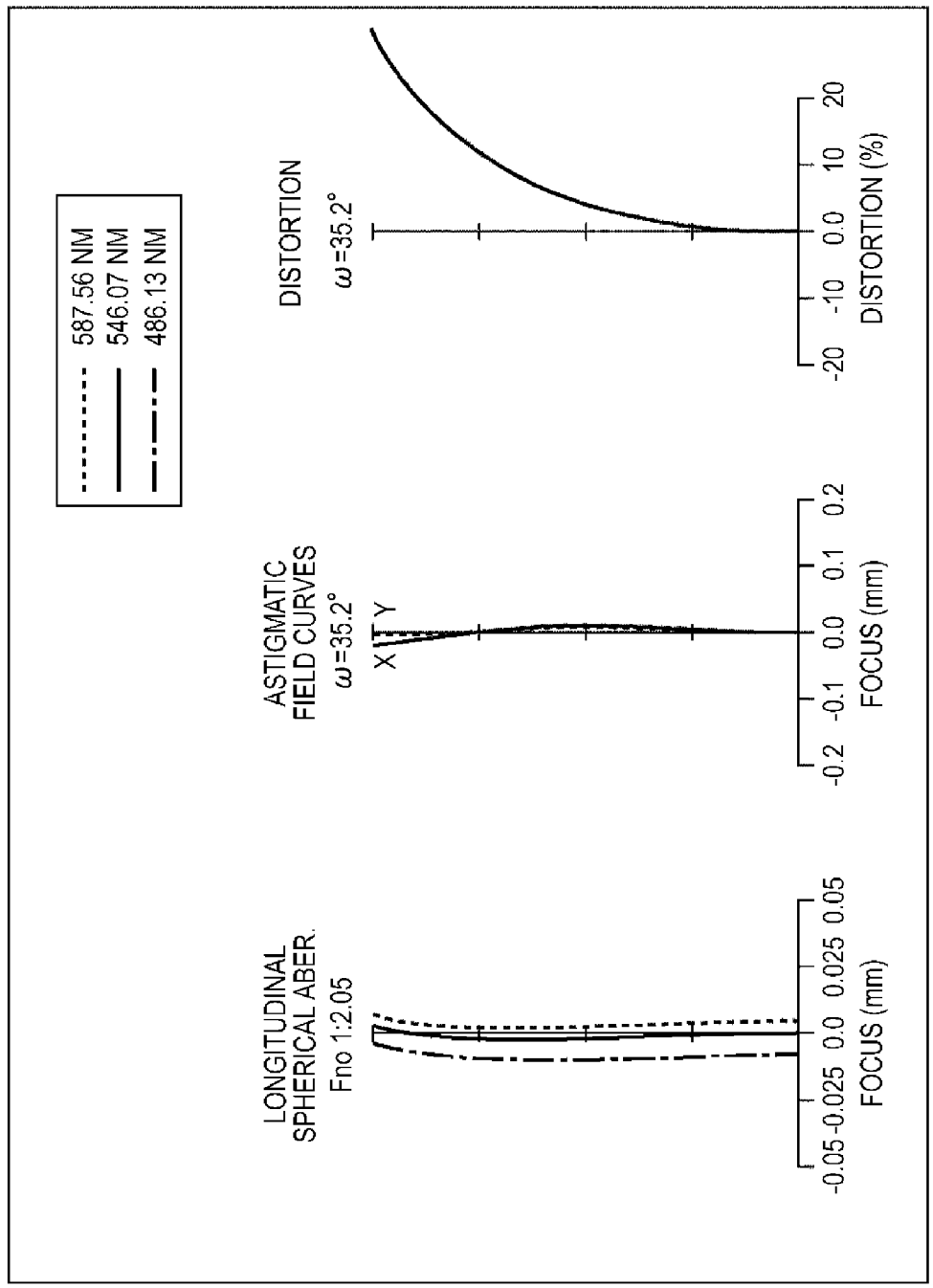
FIG. 18 is an aberration diagram showing a spherical aberration, astigmatism, and distortion in Example 5.

FIG. 18 is an aberration diagram showing a spherical aberration (chromatic aberration), astigmatism, and distortion in Example 5. The left portion of FIG. 18 shows the spherical aberration (chromatic aberration). The central portion of FIG. 18 shows the astigmatism. The right portion of FIG. 18 shows the distortion.

According to Example 5, an imaging apparatus including a lens having a total optical length of as compact as 3.22 mm and excellent imaging performance while having the following characteristics is provided: the spherical aberration, the astigmatism, and the distortion are well corrected as shown in FIG. 18; the numerical aperture is as large as 2.05; and the half viewing angle is as wide as 35.2 degrees.

Figure 19:
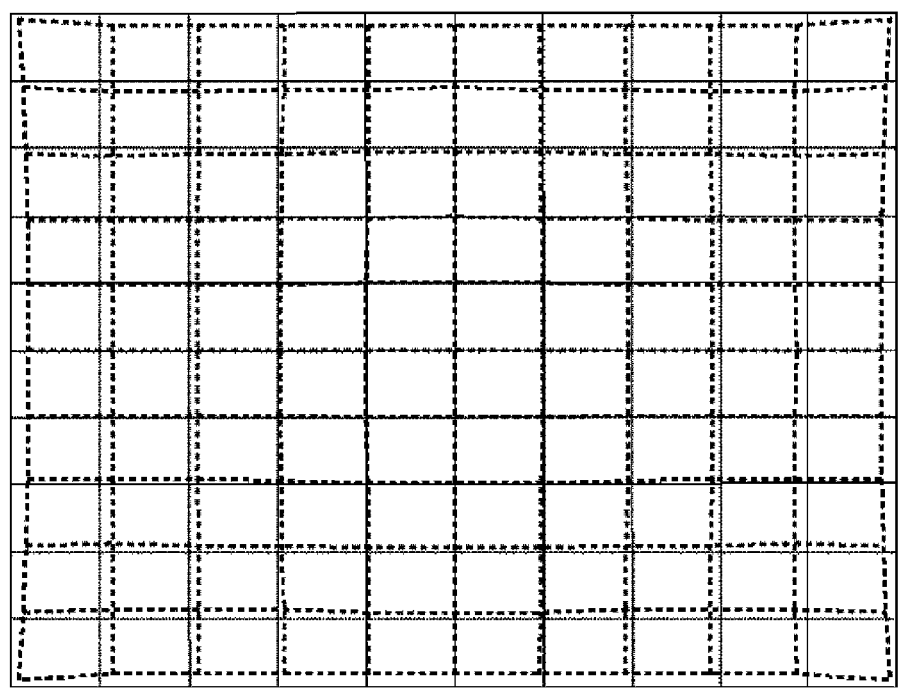
FIG. 19 shows a distortion lattice pattern in Example 5.

Further, in Example 5, the lens group 210 has large positive power and a focal length of 2.57 mm and the lens group 220 has small positive power and a focal length of 26.3 mm. A positive (pincushion-shaped) optical distortion of 29.5% produced by the thus configured lens groups 210 and 220 cancels large negative (barrel-shaped) optical distortion produced by the curved imaging device 130 and hence reduces optical distortion produced in the entire imaging apparatus to a small positive (pincushion-shaped) optical distortion of 0.90% as shown in FIG. 19.

Example 6

Figure 20:
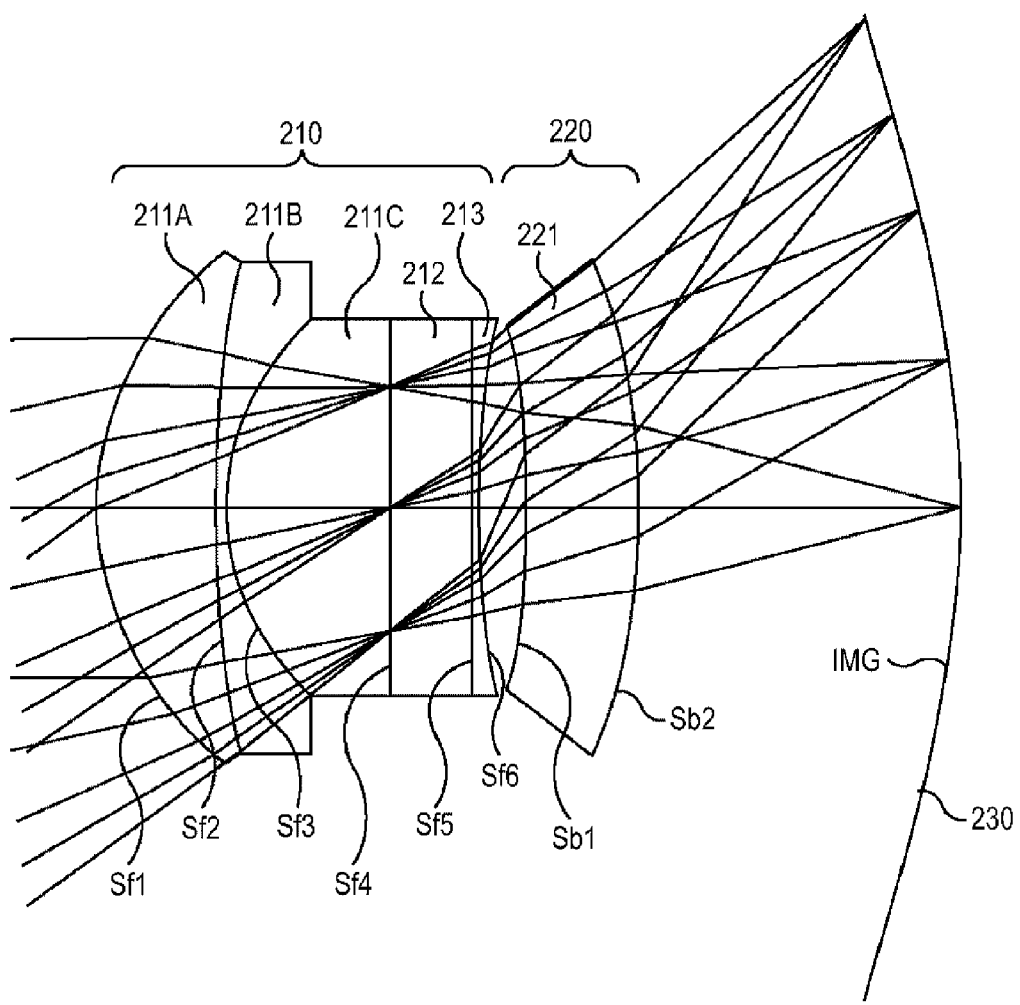
FIG. 20 shows an example of the configuration of an imaging apparatus according to Example 6.

FIG. 20 shows an example of the configuration of an imaging apparatus for a ⅕-size CMOS image sensor having 5-mega pixels arranged at 0.9-μm intervals.

The imaging apparatus shown in FIG. 20 is formed of a lens group 210, a lens group 220, and an imaging device 230.

The lens group 210 is formed of a lens element 211A, a lens element 211B, a lens element 211C, a transparent member 212, and a lens element 213 sequentially arranged from the object side toward the light receiving surface of the imaging device 230 and boned to each other. The lens group 220 is formed of a lens element 221. The lens element 211A has an object-side surface that is convex toward an object, and the transparent member 212 has a diaphragm and an infrared removal filter. The two surfaces of the lens element 221 are convex toward the light receiving surface.

The lens elements 211A, 211B, and 211C are desirably formed in a replica method in which a UV curable resin is transferred onto the transparent member 212 and irradiated with UV light. Similarly, the lens element 213 is desirably formed in the replica method on the opposite side of the transparent member 212 to the surface on which the lens element 211C has been formed. The lens element 221 is desirably formed as a glass molded lens. Specifically, the lens elements 211A, 211B, and 211C can be formed, for example, by using an NT33 glass material and an NT57 glass material manufactured by NITTO DENKO CORPORATION on a D263T glass substrate manufactured by SCHOTT AG in the replica process carried out three times. The lens element 213 can be formed by using the NT33 glass material manufactured by NITTO DENKO CORPORATION on the opposite side of the D263T glass substrate manufactured by SCHOTT AG to the lens elements 211A, 211B, and 211C. Further, the lens element 221 can be formed as a glass molded lens by using a p-SK57 glass material manufactured by SCHOTT AG.

The light receiving surface of the imaging device 230 is a curved surface having an aspheric shape and concave toward the lens groups 210 and 220. In FIG. 20, the tangential angle is set to 16.3 degrees.

In FIG. 20, the surfaces of the lens element 211A, the lens element 211B, the lens element 211C, the transparent member 212, the lens element 213, and the lens element 221, and the light receiving surface of the imaging device 230 are labeled with surface numbers Sf1, Sf2, Sf3, Sf4, Sf5, Sf6, Sb1, Sb2, and IMG.

Table 21 shows the radius of curvature R (mm), the distance d (mm), the refractive index nd, and the dispersion vd associated with the surfaces corresponding to the surface numbers in the imaging apparatus shown in FIG. 20.

TABLE 21

| Surface number | R | d | nd | vd |
| --- | --- | --- | --- | --- |
| Sf1 | 1.197 | 0.431 | 1.51 | 57.3 |
| Sf2 | 5.383 | 0.040 | 1.57 | 33.0 |
| Sf3 | 1.023 | 0.590 | 1.51 | 57.3 |
| Sf4 | INFINITY | 0.300 | 1.52 | 55.0 |
| Sf5 | INFINITY | 0.030 | 1.51 | 57.3 |
| Sf6 | 5.193 | 0.165 | | |
| Sb1 | −7.616 | 0.407 | 1.58 | 59.4 |
| Sb2 | −3.221 | 1.178 | | |
| IMG | −2.922 | | | |

Table 22 shows the fourth, sixth, eighth, and tenth aspheric coefficients of aspheric surfaces in the imaging apparatus shown in FIG. 20, specifically, the surface Sf1 of the lens element 211A, the surface Sf2 of the lens element 211B, the surface Sf3 of the lens element 211C, the surface Sf6 of the lens element 213, the surfaces Sb1 and Sb2 of the lens element 221, and the light receiving surface IMG of the imaging device 230. In Table 22, K denotes the conic coefficient, A denotes the fourth aspheric coefficient; B denotes the sixth aspheric coefficient; C denotes the eighth aspheric coefficient; and D denotes the tenth aspheric coefficient.

TABLE 22

| Surface Sf1 | K: −0.755 | A: 0.574E−01 | B: 0.317E−01 | C: −0.225E−01 | D: 0.155E−01 |
| --- | --- | --- | --- | --- | --- |
| Surface Sf2 | K: −0.755 | A: 0.574E−01 | B: 0.317E−01 | C: −0.224E−01 | D: 0.155E−01 |
| Surface Sf3 | K: 0.967 | A: 0.147E+00 | B: 0.185E+00 | C: −0.510E+00 | D: −0.256E+01 |
| Surface Sf6 | K: −0.867 | A: 0.606E−01 | B: −0.405E−01 | C: 0.116E+00 | D: 0.281E−01 |
| Surface Sb1 | K: 0.821 | A: −0.101E+00 | B: −0.172E+00 | C: 0.354E−01 | D: −0.536E+00 |
| Surface Sb2 | K: 0.689 | A: −0.337E−02 | B: −0.275E−01 | C: −0.515E−01 | D: 0.584E−02 |
| Surface IMG | K: −10.00 | A: 0.0 | B: 0.0 | C: 0.0 | D: 0.0 |

Table 23 shows the focal length f, the numerical aperture F, the half viewing angle ω, the lens length H of the entire optical system (lens group 210 and lens group 220) in the imaging apparatus shown in FIG. 20. In the example shown in FIG. 20, the focal length f is set to 2.50 mm, the numerical aperture F is set to 2.05, the half viewing angle

ω is set to 35.1 degrees, and the lens length H is set to 3.14 mm.

TABLE 23

| | |
|---|---|
| f (focal length) = | 2.50 mm |
| F (numerical aperture) = | 2.05 |
| ω (half viewing angle) = | 35.1 deg |
| H (total lens length) = | 3.14 mm |

Table 24 shows that the conditional expressions (1) to (3) are satisfied in Example 6.

TABLE 24

| | |
|---|---|
| Conditional expression (1) | 0.50 |
| Conditional expression (2) | 1.12 |
| Conditional expression (3) | 3.69 |

As shown in Table 24, the conditions defined by the conditional expressions (1) to (3) are satisfied in Example 6.

Figure 21:
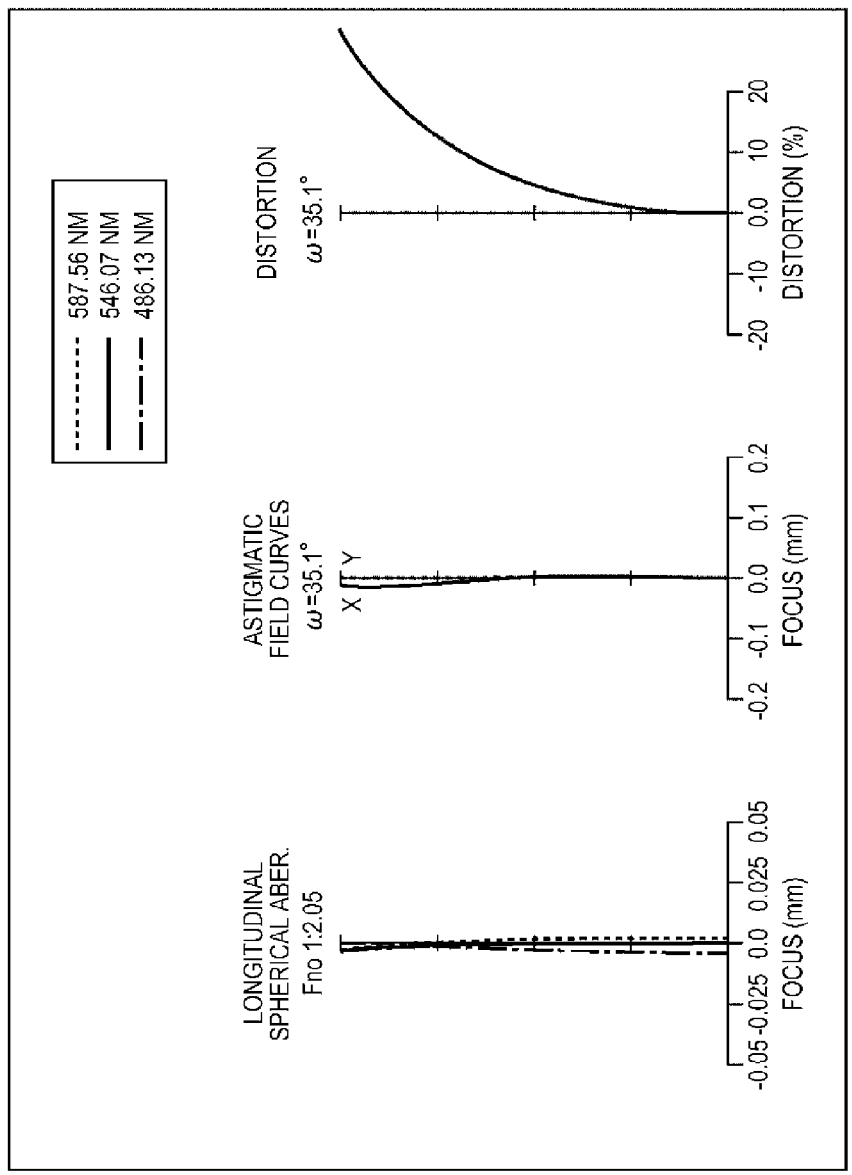
FIG. 21 is an aberration diagram showing a spherical aberration, astigmatism, and distortion in Example 6.

FIG. 21 is an aberration diagram showing a spherical aberration (chromatic aberration), astigmatism, and distortion in Example 6. The left portion of FIG. 21 shows the spherical aberration (chromatic aberration). The central portion of FIG. 21 shows the astigmatism. The right portion of FIG. 21 shows the distortion.

According to Example 6, an imaging apparatus including a lens having a total optical length of as compact as 3.14 mm and excellent imaging performance while having the following characteristics is provided: the spherical aberration, the astigmatism, and the distortion are well corrected as shown in FIG. 21; the numerical aperture is as large as 2.05; and the half viewing angle is as wide as 35.1 degrees.

Figure 22:
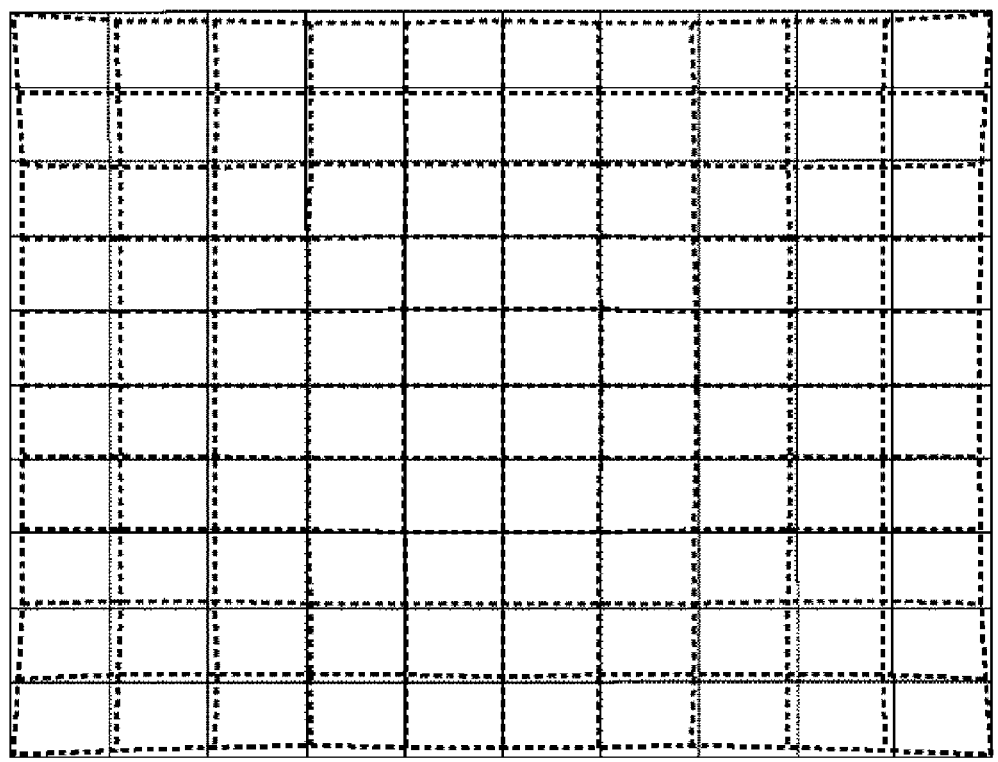
FIG. 22 shows a distortion lattice pattern in Example 6.

Further, in Example 6, the lens group 210 has large positive power and a focal length of 2.50 mm and the lens group 220 has relatively small positive power and a focal length of 9.22 mm. A positive (pincushion-shaped) optical distortion of 29.4% produced by the thus configured lens groups 210 and 220 cancels large negative (barrel-shaped) optical distortion produced by the curved imaging device 230 and hence reduces optical distortion produced in the entire imaging apparatus to a small positive (pincushion-shaped) optical distortion of 1.197% as shown in FIG. 22.

Example 7

Figure 23:
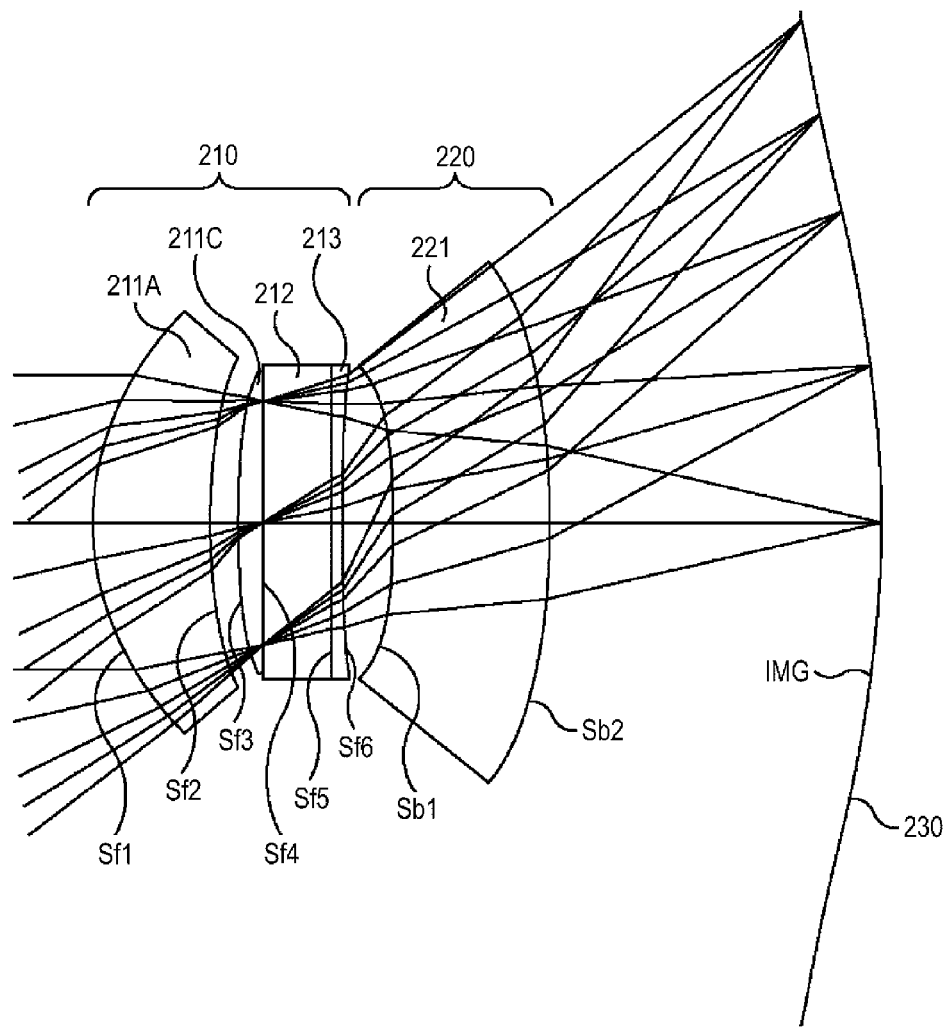
FIG. 23 shows an example of the configuration of an imaging apparatus according to Example 7.

FIG. 23 shows an example of the configuration of an imaging apparatus for a ¼-size CMOS image sensor having 8-mega pixels arranged at 1.1-μm intervals.

The imaging apparatus shown in FIG. 23 is formed of a lens group 210, a lens group 220, and an imaging device 230.

The lens group 210 is formed of a lens element 211A, air, a lens element 211C, a transparent member 212, and a lens element 213 sequentially arranged from the object side toward the light receiving surface of the imaging device 230. The lens group 220 is formed of a lens element 221. The lens element 211A has a meniscus shape and an object-side surface that is convex toward an object, and the transparent member 212 has a diaphragm and an infrared removal filter. The two surfaces of the lens element 221 are convex toward the light receiving surface.

The lens element 211A is desirably formed as a plastic molded lens or a glass molded lens. The lens element 211C is desirably formed in a replica method in which a UV curable resin is transferred onto the transparent member 212 and irradiated with UV light. Similarly, the lens element 213 is desirably formed in the replica method on the opposite side of the transparent member 212 to the side on which the lens element 211C has been formed. The lens element 221 is desirably formed as a glass molded lens. Specifically, the lens element 211C can be formed, for example, by using an NT33 glass material manufactured by NITTO DENKO CORPORATION on a D263T glass substrate manufactured by SCHOTT AG in the replica process. The lens element 213 can be formed by using the NT33 glass material manufactured by NITTO DENKO CORPORATION on the opposite side of the D263T glass substrate manufactured by SCHOTT AG to the lens element 211C. Further, the lens element 221 can be formed as a glass molded lens by using a p-SK57 glass material manufactured by SCHOTT AG.

The light receiving surface of the imaging device 230 is a curved surface having an aspheric shape and concave toward the lens groups 210 and 220. In FIG. 23, the tangential angle is set to 9.64 degrees.

In FIG. 23, the surfaces of the lens element 211A, the lens element 211C, the transparent member 212, the lens element 213, and the lens element 221, and the light receiving surface of the imaging device 230 are labeled with surface numbers Sf1, Sf2, Sf3, Sf4, Sf5, Sf6, Sb1, Sb2, and IMG.

Table 25 shows the radius of curvature R (mm), the distance d (mm), the refractive index nd, and the dispersion vd associated with the surfaces corresponding to the surface numbers in the imaging apparatus shown in FIG. 23.

TABLE 25

| Surface number | R | d | nd | vd |
|---|---|---|---|---|
| Sf1 | 1.178 | 0.514 | 1.53 | 51.7 |
| Sf2 | 2.641 | 0.119 | | |
| Sf3 | 3.424 | 0.109 | 1.51 | 57.3 |
| Sf4 | INFINITY | 0.300 | 1.52 | 55.0 |
| Sf5 | INFINITY | 0.050 | 1.51 | 57.3 |
| Sf6 | 10.85 | 0.224 | | |
| Sb1 | −3.618 | 0.687 | 1.632 | 23.0 |
| Sb2 | −3.650 | 1.447 | | |
| IMG | −4.717 | | | |

Table 26 shows the fourth, sixth, eighth, and tenth aspheric coefficients of aspheric surfaces in the imaging apparatus shown in FIG. 23, specifically, the surfaces Sf1 and Sf2 of the lens element 211A, the surface Sf3 of the lens element 211C, the surface Sf6 of the lens element 213, the surfaces Sb1 and Sb2 of the lens element 221, and the light receiving surface IMG of the imaging device 230. In Table 26, K denotes the conic coefficient, A denotes the fourth aspheric coefficient; B denotes the sixth aspheric coefficient; C denotes the eighth aspheric coefficient; and D denotes the tenth aspheric coefficient.

TABLE 26

| Surface Sf1 | K: −0.951 | A: 0.492E−01 | B: 0.515E−01 | C: −0.115E+00 | D: 0.742E−01 |
|---|---|---|---|---|---|
| Surface Sf2 | K: −0.304 | A: 0.233E−02 | B: 0.555E−01 | C: −0.254E+00 | D: 0.799E+00 |
| Surface Sf3 | K: 0.238 | A: 0.216E−01 | B: 0.224E+00 | C: −0.367E+00 | D: 0.138241E+01 |
| Surface Sf6 | K: −0.640 | A: −0.183E−01 | B: 0.198E+00 | C: −0.102E+01 | D: 0.205E+01 |
| Surface Sb1 | K: −0.972 | A: −0.161E+00 | B: −0.469E+00 | C: 0.931E+00 | D: −0.227E+01 |
| Surface Sb2 | K: −1.000 | A: −0.843E−02 | B: −0.459E−01 | C: 0.137E−01 | D: −0.506E−02 |
| Surface IMG | K: 0.743 | A: 0.713E−02 | B: 0.208E−03 | C: 0.190E−03 | D: −0.269E−04 |

Table 27 shows the focal length f, the numerical aperture F, the half viewing angle ω, the lens length H of the entire optical system (lens group 210 and lens group 220) in the imaging apparatus shown in FIG. 23. In the example shown in FIG. 23, the focal length f is set to 2.86 mm, the numerical aperture F is set to 2.25, the half viewing angle

ω is set to 37.7 degrees, and the lens length H is set to 3.45 mm.

TABLE 27

| f (focal length) = 2.86 mm |
|---|
| F (numerical aperture) = 2.25 |
| ω (half viewing angle) = 37.7 deg |
| H (total lens length) = 3.45 mm |

Table 28 shows that the conditional expressions (1) to (3) are satisfied in Example 7.

TABLE 28

| Conditional expression (1) | 0.52 |
|---|---|
| Conditional expression (2) | 0.95 |
| Conditional expression (3) | 30.63 |

As shown in Table 28, the conditions defined by the conditional expressions (1) to (3) are satisfied in Example 7.

Figure 24:
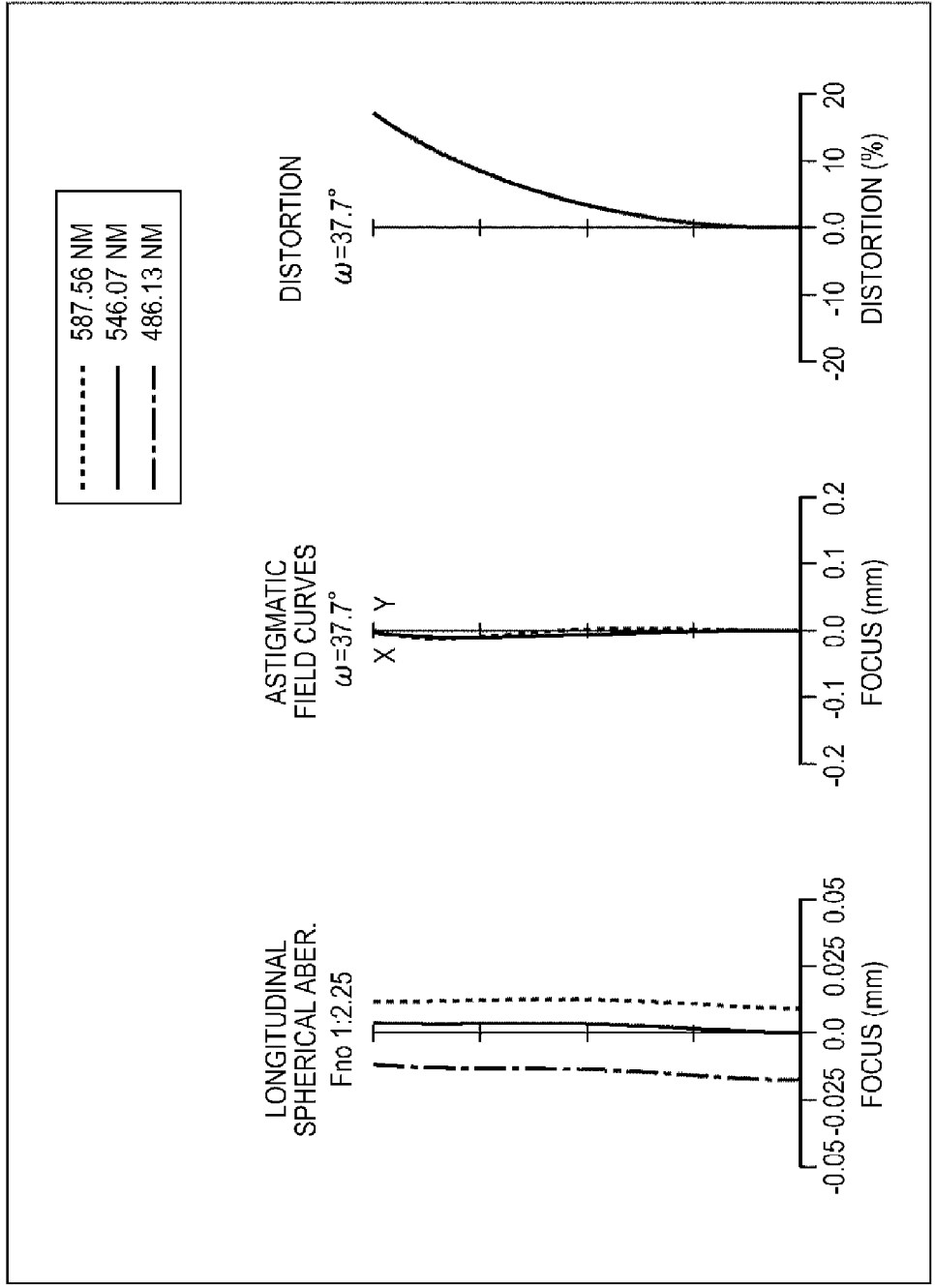
FIG. 24 is an aberration diagram showing a spherical aberration, astigmatism, and distortion in Example 7.

FIG. 24 is an aberration diagram showing a spherical aberration (chromatic aberration), astigmatism, and distortion in Example 7. The left portion of FIG. 24 shows the spherical aberration (chromatic aberration). The central portion of FIG. 24 shows the astigmatism. The right portion of FIG. 24 shows the distortion.

According to Example 7, an imaging apparatus including a lens having a total optical length of as compact as 3.45 mm and excellent imaging performance while having the following characteristics is provided: the spherical aberration, the astigmatism, and the distortion are well corrected as shown in FIG. 24; the numerical aperture is as large as 2.25; and the half viewing angle is as wide as 37.7 degrees.

Figure 25:
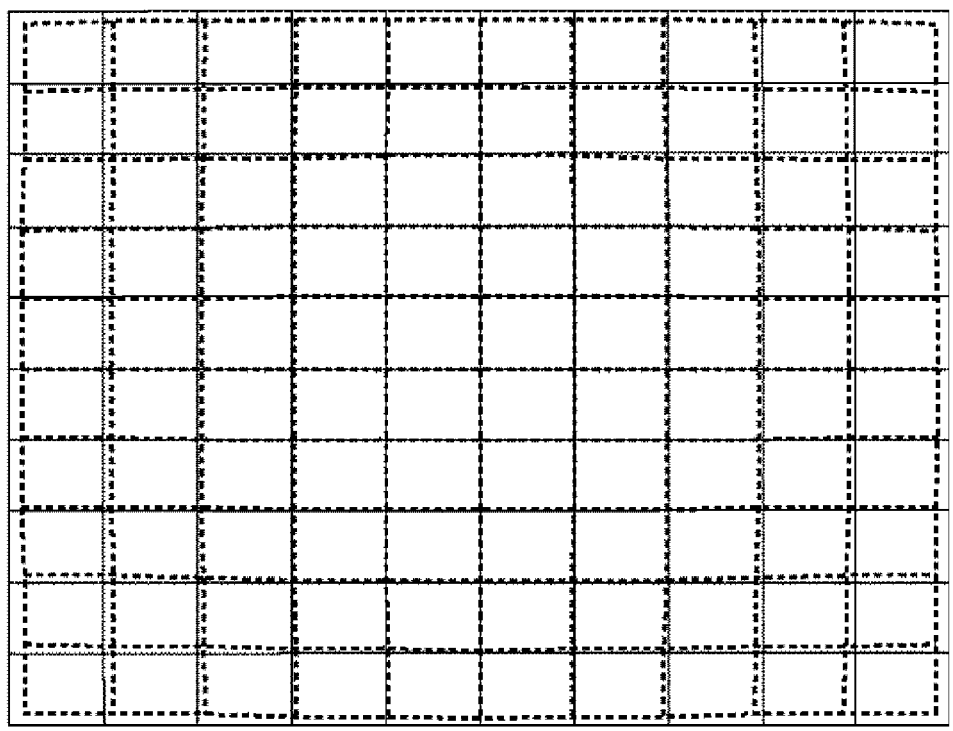
FIG. 25 shows a distortion lattice pattern in Example 7.

Further, in Example 7, the lens group 210 has large positive power and a focal length of 2.70 mm and the lens group 220 has small positive power and a focal length of 87.5 mm. A positive (pincushion-shaped) optical distortion of 17.0% produced by the thus configured lens groups 210 and 220 cancels large negative (barrel-shaped) optical distortion produced by the curved imaging device 230 and hence reduces optical distortion produced in the entire imaging apparatus to a small negative (barrel-shaped) optical distortion of 0.411% as shown in FIG. 25.

Example 8

Figure 26:
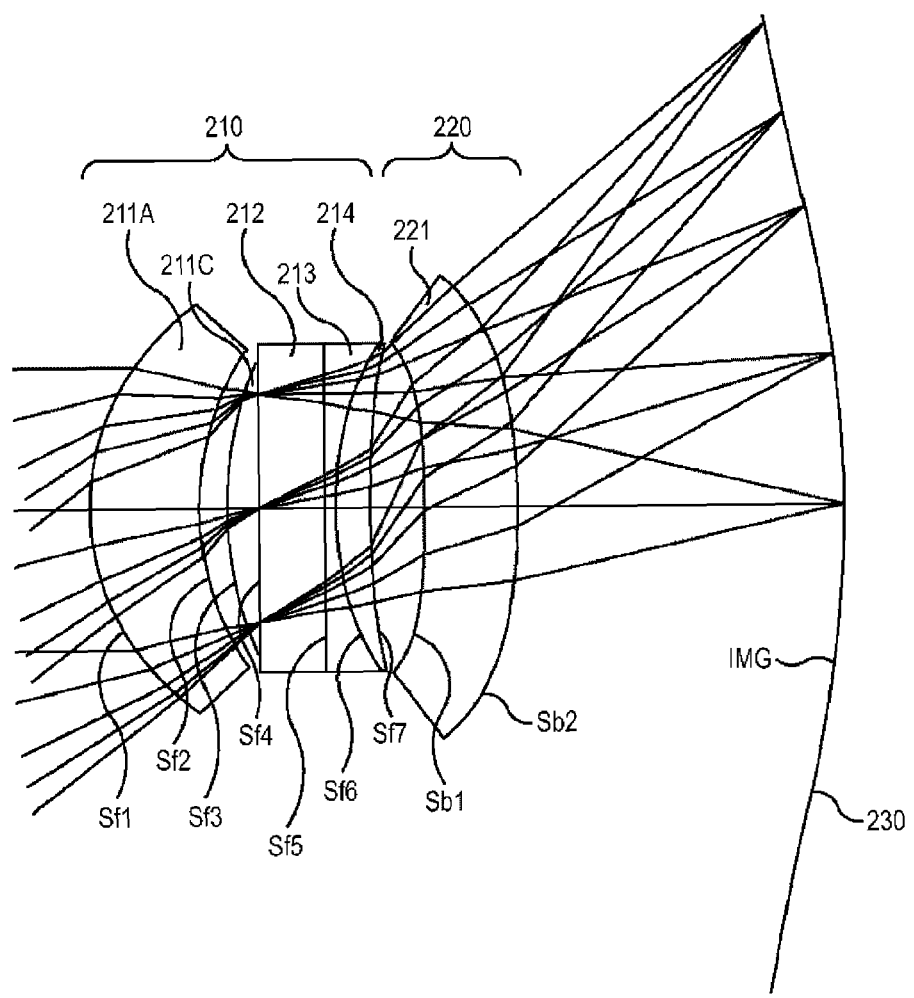
FIG. 26 shows an example of the configuration of an imaging apparatus according to Example 8.

FIG. 26 shows an example of the configuration of an imaging apparatus for a ¼-size CMOS image sensor having 8-mega pixels arranged at
1.1-μm intervals.

The imaging apparatus shown in FIG. 26 is formed of a lens group 210, a lens group 220, and an imaging device 230.

The lens group 210 is formed of a lens element 211A, air, a lens element 211C, a transparent member 212, a lens element 213, and a lens element 214 sequentially arranged from the object side toward the light receiving surface of the imaging device 230. The lens group 220 is formed of a lens element 221. The lens element 211A has a meniscus shape and an object-side surface that is convex toward an object, and the transparent member 212 has a diaphragm and an infrared removal filter. The two surfaces of the lens element 221 are convex toward the light receiving surface.

The lens element 211A is desirably formed as a plastic molded lens or a glass molded lens. The lens element 211C is desirably formed in a replica method in which a UV curable resin is transferred onto the transparent member 212 and irradiated with UV light. Similarly, the lens elements 213 and 214 are desirably formed in the replica method on the opposite side of the transparent member 212 to the surface on which the lens element 211C has been formed. The lens element 221 is desirably formed as a glass molded lens. Specifically, the lens element 211C can be formed, for example, by using an NT33 glass material manufactured by NITTO DENKO CORPORATION on a D263T glass substrate manufactured by SCHOTT AG in the replica process. The lens elements 213 and 214 can be formed by using a 414C glass material manufactured by ASAHI KASEI CORPORATION and the NT33 glass material manufactured by NITTO DENKO CORPORATION on the opposite side of the D263T glass substrate manufactured by SCHOTT AG to the lens element 211C in the replica process carried out twice. Further, the lens element 221 can be formed as a glass molded lens by using a p-SK57 glass material manufactured by SCHOTT AG.

The light receiving surface of the imaging device 230 is a curved surface having an aspheric shape and concave toward the lens groups 210 and 220. In FIG. 26, the tangential angle is set to 10.7 degrees.

In FIG. 26, the surfaces of the lens element 211A, the lens element 211C, the transparent member 212, the lens element 213, the lens element 214, and the lens element 221, and the light receiving surface of the imaging device 230 are labeled with surface numbers Sf1, Sf2, Sf3, Sf4, Sf5, Sf6, Sf7, Sb1, Sb2, and IMG.

Table 29 shows the radius of curvature R (mm), the distance d (mm), the refractive index nd, and the dispersion vd associated with the surfaces corresponding to the surface numbers in the imaging apparatus shown in FIG. 26.

TABLE 29

| Surface number | R | d | nd | vd |
|---|---|---|---|---|
| Sf1 | 1.080 | 0.501 | 1.53 | 51.7 |
| Sf2 | 1.385 | 0.126 | | |
| Sf3 | 1.739 | 0.148 | 1.51 | 57.3 |
| Sf4 | INFINITY | 0.300 | 1.52 | 55.0 |
| Sf5 | INFINITY | 0.050 | 1.59 | 29.6 |
| Sf6 | 1.831 | 0.156 | 1.51 | 57.3 |
| Sf7 | 5.671 | 0.250 | | |
| Sb1 | −4.525 | 0.420 | 1.632 | 23.0 |
| Sb2 | −2.964 | 1.499 | | |
| IMG | −4.626 | | | |

Table 30 shows the fourth, sixth, eighth, and tenth aspheric coefficients of aspheric surfaces in the imaging apparatus shown in FIG. 26, specifically, the surfaces Sf1 and Sf2 of the lens element 211A, the surface Sf3 of the lens element 211C, the surface Sf6 of the lens element 213, the surface Sf7 of the lens element 214, the surfaces Sb1 and Sb2 of the lens element 221, and the light receiving surface IMG of the imaging device 230. In Table 30, K denotes the conic coefficient, A denotes the fourth aspheric coefficient; B denotes the sixth aspheric coefficient; C denotes the eighth aspheric coefficient; and D denotes the tenth aspheric coefficient.

TABLE 30

| Surface Sf1 | K: −0.711 | A: 0.733E−01 | B: 0.299E−01 | C: 0.408E−01 | D: −0.225E−01 |
|---|---|---|---|---|---|
| Surface Sf2 | K: 1.000 | A: 0.441E−01 | B: 0.216E−01 | C: −0.142E+00 | D: −0.181E+00 |
| Surface Sf3 | K: 0.497 | A: 0.398E−01 | B: 0.108E+00 | C: −0.418E+00 | D: 0.352E+00 |
| Surface Sf6 | K: −0.166 | A: 0.1877E+00 | B: −0.330E+00 | C: 0.954E+00 | D: −0.729E+00 |
| Surface Sf7 | K: 1.000 | A: 0.373E−01 | B: −0.141E−01 | C: 0.122E+00 | D: −0.632E−01 |
| Surface Sb1 | K: 0.487 | A: −0.109E+00 | B: −0.282E+00 | C: 0.412E+00 | D: −0.807E+00 |
| Surface Sb2 | K: 0.575 | A: −0.190E−01 | B: −0.946E−01 | C: 0.574E−01 | D: −0.543E−01 |
| Surface IMG | K: 0.743 | A: 0.713E−02 | B: 0.208E−03 | C: 0.190E−03 | D: −0.269E−04 |

Table 31 shows the focal length f, the numerical aperture F, the half viewing angle ω, the lens length H of the entire optical system (lens group 210 and lens group 220) in the imaging apparatus shown in FIG. 26. In the example shown in FIG. 26, the focal length f is set to 2.86 mm, the numerical aperture F is set to 2.25, the half viewing angle ω is set to 37.6 degrees, and the lens length H is set to 3.45 mm.

TABLE 31

| f (focal length) = 2.86 mm |
|---|
| F (numerical aperture) = 2.25 |
| ω (half viewing angle) = 37.6 deg |
| H (total lens length) = 3.45 mm |

Table 32 shows that the conditional expressions (1) to (3) are satisfied in Example 8.

TABLE 32

| Conditional expression (1) | 0.46 |
|---|---|
| Conditional expression (2) | 1.09 |
| Conditional expression (3) | 4.26 |

As shown in Table 32, the conditions defined by the conditional expressions (1) to (3) are satisfied in Example 8.

Figure 27:
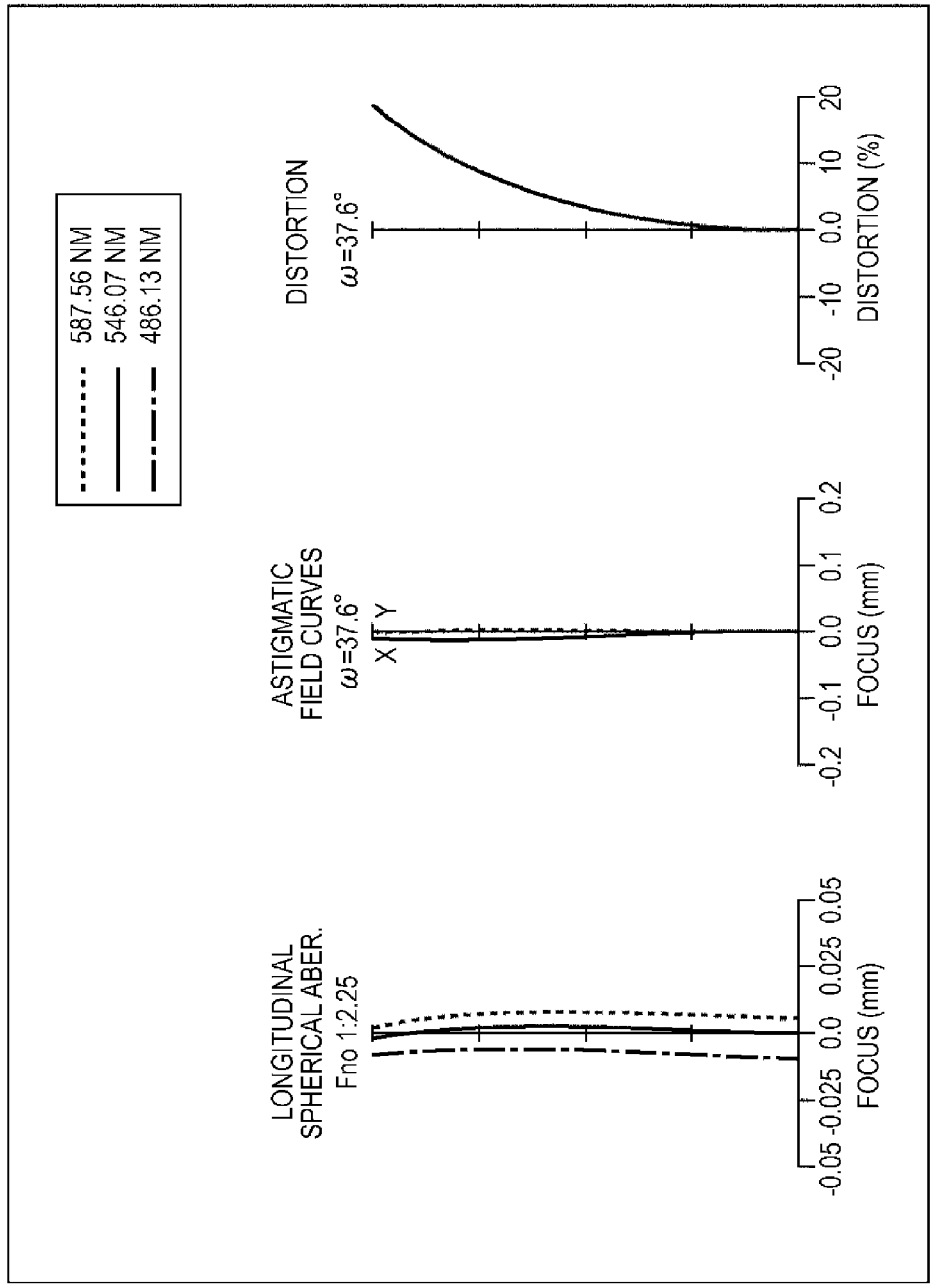
FIG. 27 is an aberration diagram showing a spherical aberration, astigmatism, and distortion in Example 8.

FIG. 27 is an aberration diagram showing a spherical aberration (chromatic aberration), astigmatism, and distortion in Example 8. The left portion of FIG. 27 shows the spherical aberration (chromatic aberration). The central portion of FIG. 27 shows the astigmatism. The right portion of FIG. 27 shows the distortion.

According to Example 8, an imaging apparatus including a lens having a total optical length of as compact as 3.45 mm and excellent imaging performance while having the following characteristics is provided: the spherical aberration, the astigmatism, and the distortion are well corrected as shown in FIG. 27; the numerical aperture is as large as 2.25; and the half viewing angle is as wide as 37.6 degrees.

Figure 28:
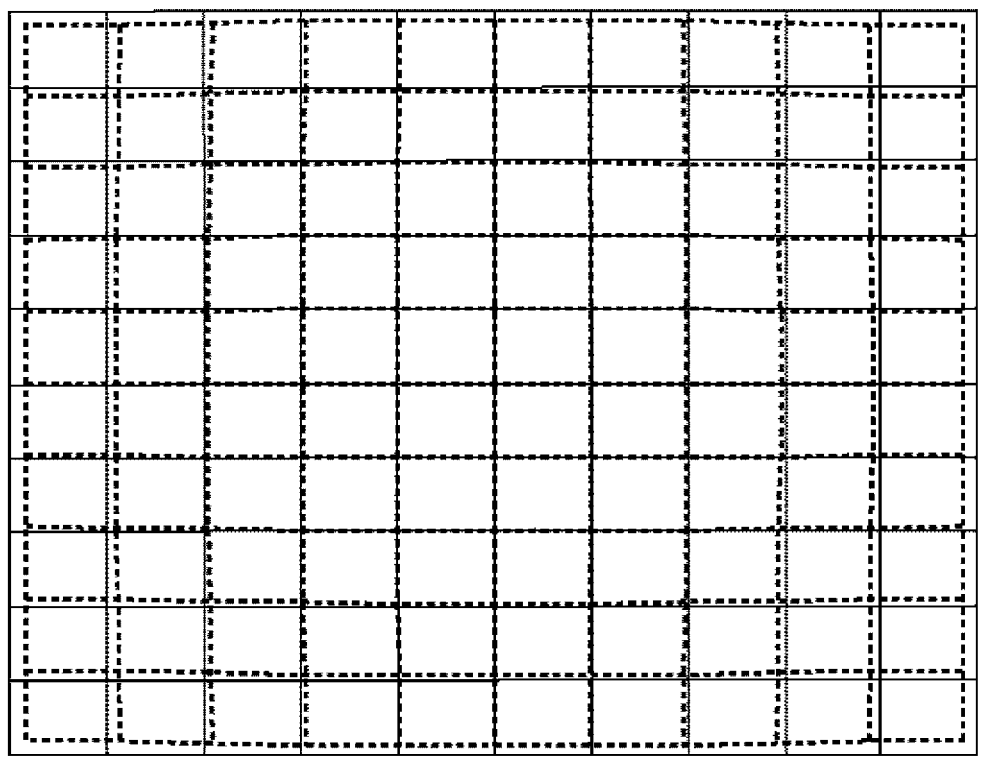
FIG. 28 shows a distortion lattice pattern in Example 8.

Further, in Example 8, the lens group 210 has large positive power and a focal length of 3.13 mm and the lens group 220 has small positive power and a focal length of 12.2 mm. A positive (pincushion-shaped) optical distortion of 18.6% produced by the thus configured lens groups 210 and 220 cancels large negative (barrel-shaped) optical distortion produced by the curved imaging device 230 and hence reduces optical distortion produced in the entire imaging apparatus to a small negative (barrel-shaped) optical distortion of 0.676% as shown in FIG. 28.

Example 9

Figure 29:
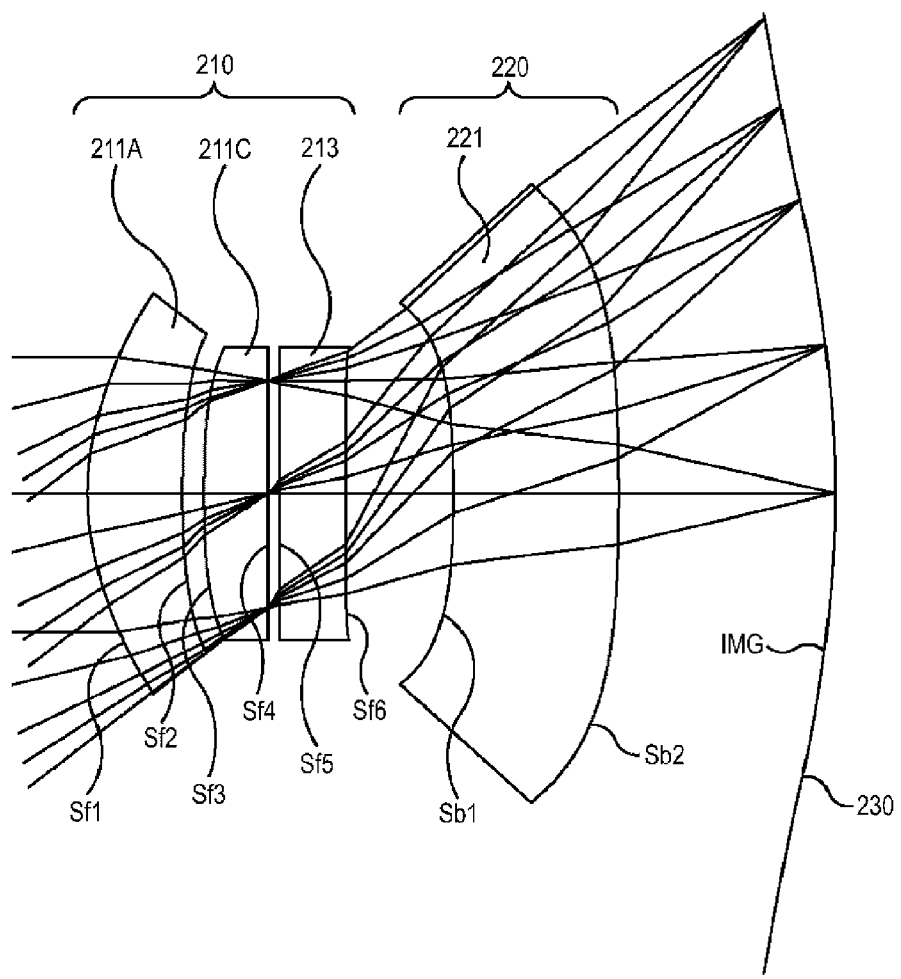
FIG. 29 shows an example of the configuration of an imaging apparatus according to Example 9.

FIG. 29 shows an example of the configuration of an imaging apparatus for a ¼-size CMOS image sensor having 8-mega pixels arranged at 1.1-μm intervals.

The imaging apparatus shown in FIG. 29 is formed of a lens group 210, a lens group 220, and an imaging device 230.

The lens group 210 is formed of a lens element 211A, air, a lens element 211C, a diaphragm, air, and a lens element 213 sequentially arranged from the object side toward the light receiving surface of the imaging device 230. The lens group 220 is formed of a lens element 221. The lens element 211A has a meniscus shape and an object-side surface that is convex toward an object, and the diaphragm is disposed on the image plane side of the lens element 211C. The two surfaces of the lens element 221 are convex toward the light receiving surface. An infrared removal filter is provided on the image plane side of the lens element 221.

Each of the lens element 211A, the lens element 211C, the lens element 213, and the lens element 221 is desirably formed as a plastic molded lens or a glass molded lens. The infrared removal filter is desirably disposed on the image plane side of the lens element 221.

The light receiving surface of the imaging device 230 is a curved surface having an aspheric shape and concave toward the lens groups 210 and 220. In FIG. 29, the tangential angle is set to 8.5 degrees.

In FIG. 29, the surfaces of the lens element 211A, the lens element 211C, the lens element 213, and the lens element 221, and the light receiving surface of the imaging device 230 are labeled with surface numbers Sf1, Sf2, Sf3, Sf4, Sf5, Sf6, Sb1, Sb2, and IMG.

Table 33 shows the radius of curvature R (mm), the distance d (mm), the refractive index nd, and the dispersion vd associated with the surfaces corresponding to the surface numbers in the imaging apparatus shown in FIG. 29.

TABLE 33

| Surface number | R | d | nd | vd |
|---|---|---|---|---|
| Sf1 | 1.346 | 0.438 | 1.53 | 51.7 |
| Sf2 | 4.270 | 0.100 | | |
| Sf3 | 5.326 | 0.300 | 1.53 | 51.7 |
| Sf4 | INFINITY | 0.050 | | |
| Sf5 | INFINITY | 0.300 | 1.53 | 51.7 |
| Sf6 | −18.315 | 0.501 | | |
| Sb1 | −4.578 | 0.761 | 1.632 | 23.0 |
| Sb2 | −6.457 | 1.000 | | |
| IMG | −4.827 | | | |

Table 34 shows the fourth, sixth, eighth, and tenth aspheric coefficients of aspheric surfaces in the imaging apparatus shown in FIG. 29, specifically, the surfaces Sf1 and Sf2 of the lens element 211A, the surface Sf3 of the lens element 211C, the surface Sf6 of the lens element 213, the surfaces Sb1 and Sb2 of the lens element 221, and the light receiving surface IMG of the imaging device 230. In Table 34, K denotes the conic coefficient, A denotes the fourth aspheric coefficient; B denotes the sixth aspheric coefficient; C denotes the eighth aspheric coefficient; and D denotes the tenth aspheric coefficient.

TABLE 34

| Surface Sf1 | K: −0.749 | A: 0.703E−02 | B: −0.444E−01 | C: 0.698E−01 | D: −0.825E−01 |
|---|---|---|---|---|---|
| Surface Sf2 | K: 1.000 | A: 0.425E−01 | B: 0.130E+00 | C: 0.132E+00 | D: −0.337E−01 |
| Surface Sf3 | K: 1.000 | A: 0.874E−01 | B: 0.426E+00 | C: −0.569E+00 | D: 0.901E+00 |
| Surface Sf6 | K: −1.000 | A: 0.519E−01 | B: 0.110E+00 | C: −0.693E−01 | D: 0.405E+00 |
| Surface Sb1 | K: −0.807 | A: −0.107E+00 | B: −0.225E+00 | C: 0.324E+00 | D: −0.418E+00 |
| Surface Sb2 | K: 1.000 | A: −0.524E−02 | B: −0.386E−01 | C: 0.154E−01 | D: −0.492E−02 |
| Surface IMG | K: 0.743 | A: 0.713E−02 | B: 0.208E−03 | C: 0.190E−03 | D: −0.269E−04 |

Table 35 shows the focal length f, the numerical aperture F, the half viewing angle ω, the lens length H of the entire optical system (lens group 210 and lens group 220) in the imaging apparatus shown in FIG. 29. In the example shown in FIG. 29, the focal length f is set to 2.81 mm, the numerical aperture F is set to 2.25, the half viewing angle ω is set to 37.8 degrees, and the lens length H is set to 3.45 mm.

TABLE 35

| f (focal length) = 2.81 mm |
|---|
| F (numerical aperture) = 2.25 |
| ω (half viewing angle) = 37.8 deg |
| H (total lens length) = 3.45 mm |

Table 36 shows that the conditional expressions (1) to (3) are satisfied in Example 9.

TABLE 36

| Conditional expression (1) | 0.65 |
|---|---|
| Conditional expression (2) | 0.91 |
| Conditional expression (3) | −10.39 |

As shown in Table 36, the conditions defined by the conditional expressions (1) to (3) are satisfied in Example 9.

Figure 30:
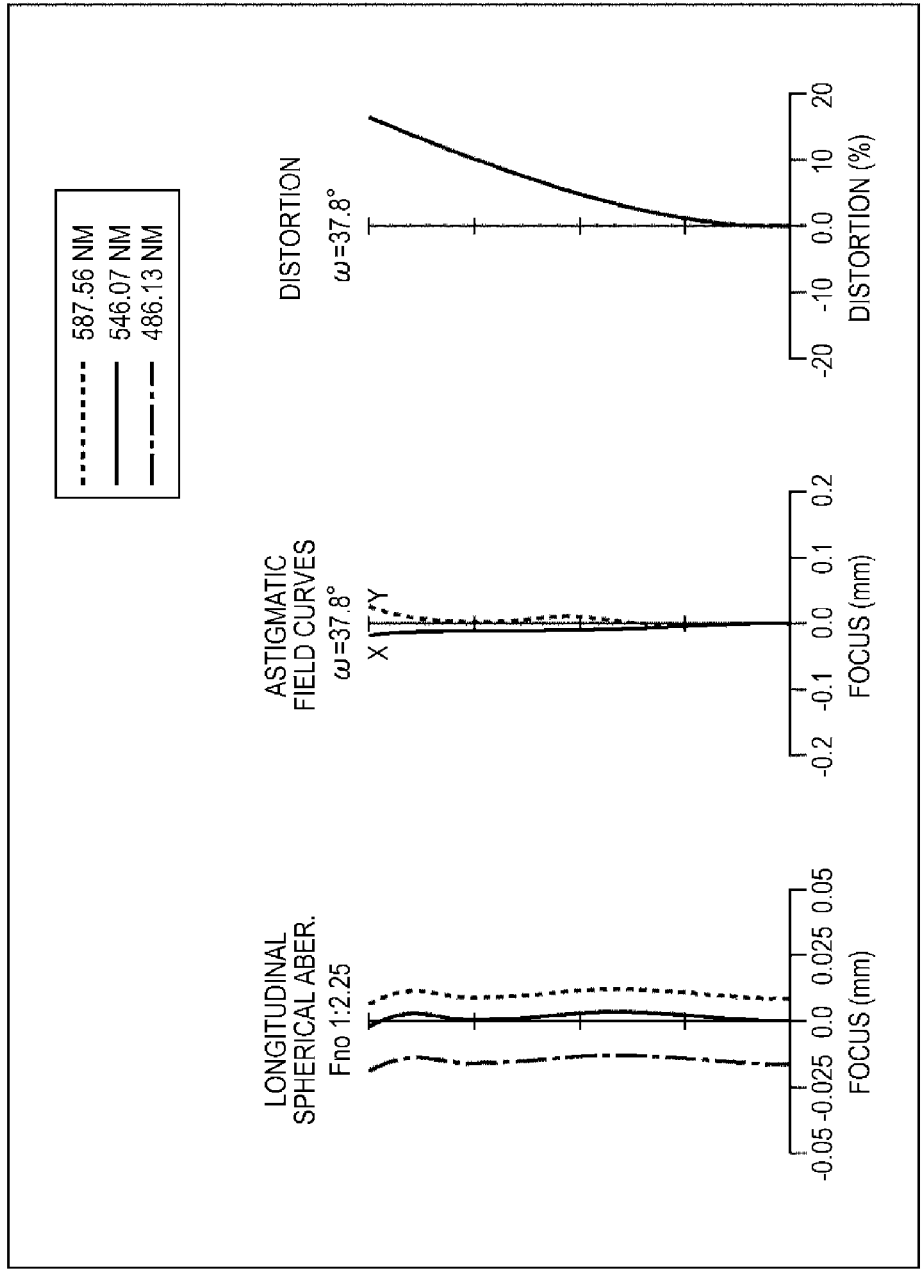
FIG. 30 is an aberration diagram showing a spherical aberration, astigmatism, and distortion in Example 9.

FIG. 30 is an aberration diagram showing a spherical aberration (chromatic aberration), astigmatism, and distortion in Example 9. The left portion of FIG. 30 shows the spherical aberration (chromatic aberration). The central portion of FIG. 30 shows the astigmatism. The right portion of FIG. 30 shows the distortion.

According to Example 9, an imaging apparatus including a lens having a total optical length of as compact as 3.45 mm and excellent imaging performance while having the following characteristics is provided: the spherical aberration, the astigmatism, and the distortion are well corrected as shown in FIG. 30; the numerical aperture is as large as 2.25; and the half viewing angle is as wide as 37.8 degrees.

Figure 31:
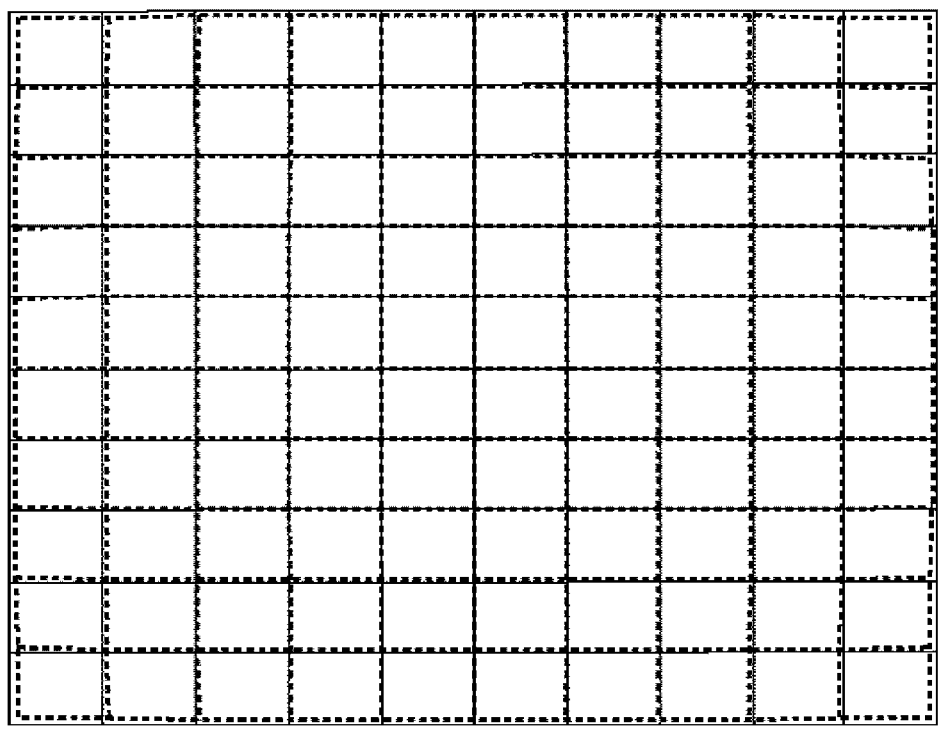
FIG. 31 shows a distortion lattice pattern in Example 9.

Further, in Example 9, the lens group 210 has large positive power and a focal length of 2.56 mm and the lens group 220 has small negative power and a focal length of 29.2 mm. A positive (pincushion-shaped) optical distortion of 16.3% produced by the thus configured lens groups 210 and 220 cancels large negative (barrel-shaped) optical distortion produced by the curved imaging device 230 and hence reduces optical distortion produced in the entire imaging apparatus to a small negative (barrel-shaped) optical distortion of 0.355% as shown in FIG. 31.

Example 10

Figure 32:
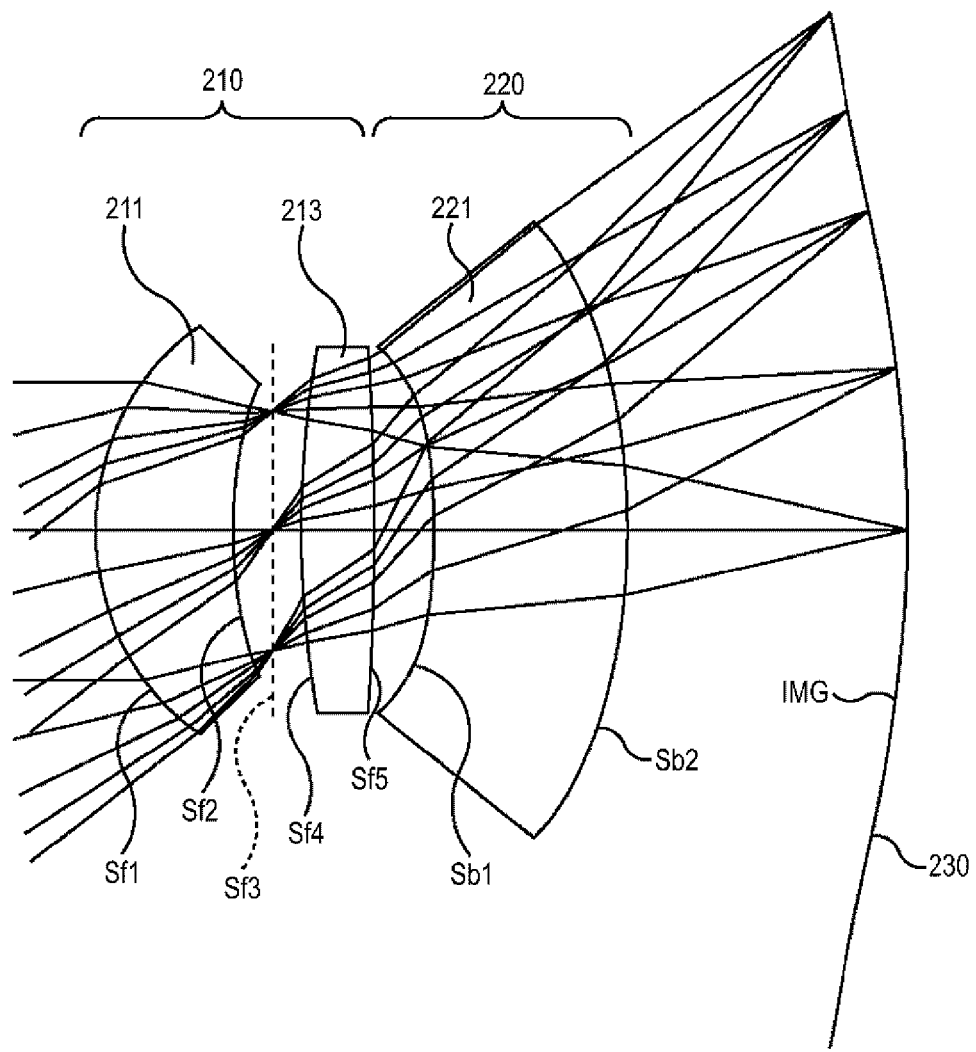
FIG. 32 shows an example of the configuration of an imaging apparatus according to Example 10.

FIG. 32 shows an example of the configuration of an imaging apparatus for a ¼-size CMOS image sensor having 8-mega pixels arranged at 1.1-µm intervals.

The imaging apparatus shown in FIG. 32 is formed of a lens group 210, a lens group 220, and an imaging device 230.

The lens group 210 is formed of a lens element 211, air, a diaphragm, air, and a lens element 213 sequentially arranged from the object side toward the light receiving surface of the imaging device 230. The lens group 220 is formed of a lens element 221. The lens element 211 has a meniscus shape and an object-side surface that is convex toward an object. The two surfaces of the lens element 221 are convex toward the light receiving surface.

Each of the lens element 211, the lens element 213, and the lens element 221 is desirably formed as a plastic molded lens or a glass molded lens. The infrared removal filter is desirably disposed on the image plane side of the lens element 221.

The light receiving surface of the imaging device 230 is a curved surface having an aspheric shape and concave toward the lens groups 210 and 220. In FIG. 32, the tangential angle is set to 8.5 degrees.

In FIG. 32, the surfaces of the lens element 211, the diaphragm, the lens element 213, and the lens element 221, and the light receiving surface of the imaging device 230 are labeled with surface numbers Sf1, Sf2, Sf3, Sf4, Sf5, Sb1, Sb2, and IMG.

Table 37 shows the radius of curvature R (mm), the distance d (mm), the refractive index nd, and the dispersion vd associated with the surfaces corresponding to the surface numbers in the imaging apparatus shown in FIG. 32.

TABLE 37

| Surface number | R | d | nd | vd |
|---|---|---|---|---|
| Sf1 | 1.095 | 0.588 | 1.53 | 51.7 |
| Sf2 | 2.306 | 0.161 | | |
| Sf3 | 2.306 | 0.130 | | |
| Sf4 | 4.612 | 0.302 | 1.53 | 51.7 |
| Sf5 | −21.365 | 0.259 | | |
| Sb1 | −2.594 | 0.820 | 1.632 | 23.0 |
| Sb2 | −2.905 | 1.191 | | |
| IMG | −4.827 | | | |

Table 38 shows the fourth, sixth, eighth, and tenth aspheric coefficients of aspheric surfaces in the imaging apparatus shown in FIG. 32, specifically, the surfaces Sf1 and Sf2 of the lens element 211, the surfaces Sf4 and Sf5 of the lens element 213, the surfaces Sb1 and Sb2 of the lens element 221, and the light receiving surface IMG of the imaging device 230. In Table 38, K denotes the conic coefficient, A denotes the fourth aspheric coefficient; B denotes the sixth aspheric coefficient; C denotes the eighth aspheric coefficient; and D denotes the tenth aspheric coefficient.

TABLE 38

| Surface Sf1 | K: −0.0044 | A: 0.764E−03 | B: 0.792E−01 | C: −0.138E+00 | D: 0.176E+00 |
| Surface Sf2 | K: 1.000 | A: 0.785E−01 | B: 0.446E−02 | C: 0.441E+00 | D: −0.530E+00 |
| Surface Sf4 | K: 1.000 | A: 0.00 | B: 0.00 | C: 0.00 | D: 0.00 |
| Surface Sf5 | K: −1.000 | A: −0.167E−01 | B: −0.243E−01 | C: −0.213E+00 | D: 0.367E+00 |
| Surface Sb1 | K: 0.878 | A: −0.116E+00 | B: −0.283E+00 | C: 0.410E+00 | D: −0.853E+00 |
| Surface Sb2 | K: −0.951 | A: −0.231E−02 | B: −0.299E−01 | C: 0.115E−01 | D: −0.397E−02 |
| Surface IMG | K: 0.743 | A: 0.713E−02 | B: 0.208E−03 | C: 0.190E−03 | D: −0.269E−04 |

Table 39 shows the focal length f, the numerical aperture F, the half viewing angle ω, the lens length H of the entire optical system (lens group 210 and lens group 220) in the imaging apparatus shown in FIG. 32. In the example shown in FIG. 32, the focal length f is set to 2.82 mm, the numerical aperture F is set to 2.25, the half viewing angle

ω is set to 37.7 degrees, and the lens length H is set to 3.45 mm.

TABLE 39

| f (focal length) = 2.82 mm |
| F (numerical aperture) = 2.25 |
| ω (half viewing angle) = 37.7 deg |
| H (total lens length) = 3.45 mm |

Table 40 shows that the conditional expressions (1) to (3) are satisfied in Example 10.

TABLE 40

| Conditional expression (1) | 0.60 |
| Conditional expression (2) | 0.89 |
| Conditional expression (3) | 491.13 |

As shown in Table 40, the conditions defined by the conditional expressions (1) to (3) are satisfied in Example 10.

Figure 33:
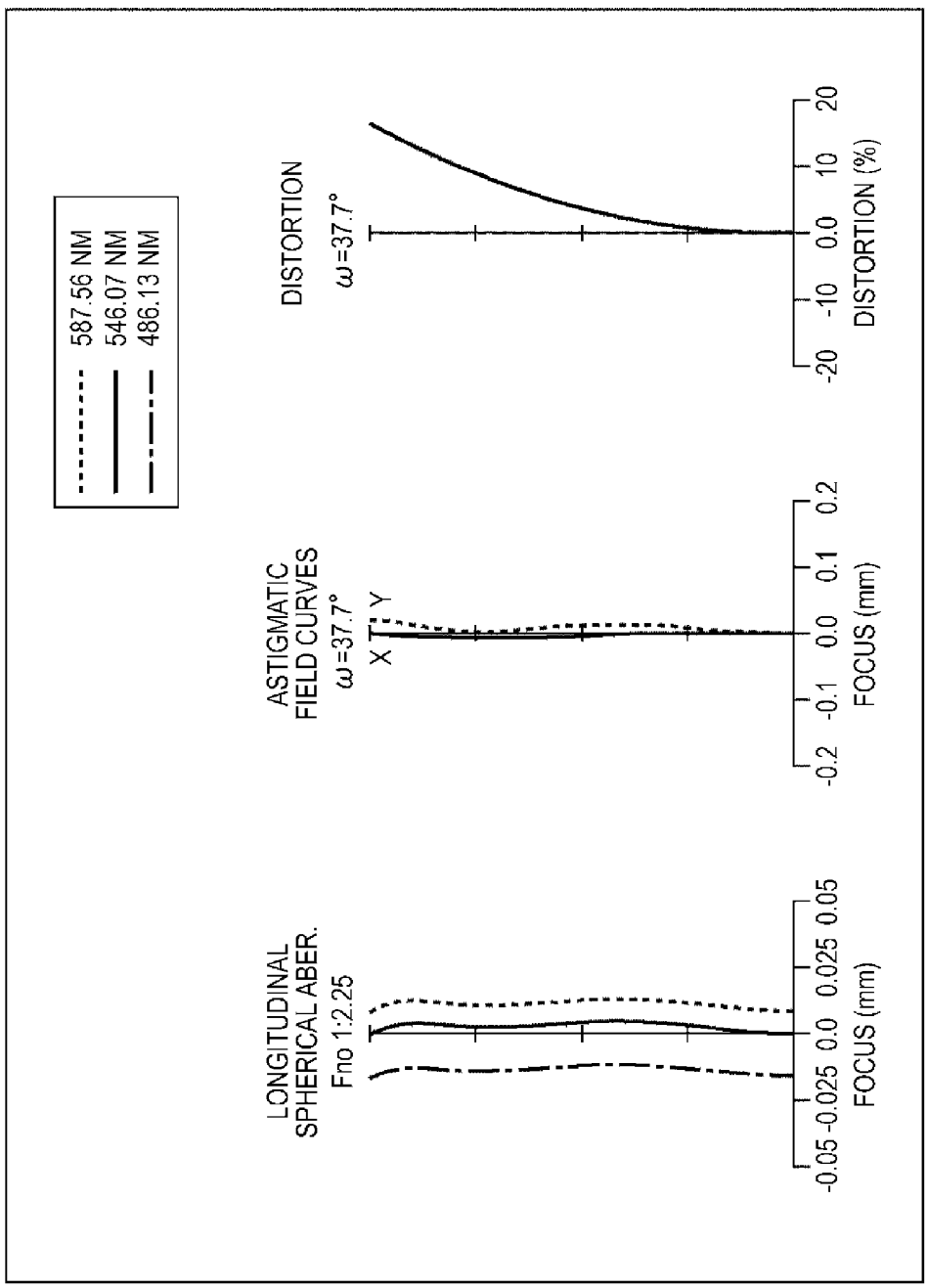
FIG. 33 is an aberration diagram showing a spherical aberration, astigmatism, and distortion in Example 10.

FIG. 33 is an aberration diagram showing a spherical aberration (chromatic aberration), astigmatism, and distortion in Example 10. The left portion of FIG. 33 shows the spherical aberration (chromatic aberration). The central portion of FIG. 33 shows the astigmatism. The right portion of FIG. 33 shows the distortion.

According to Example 10, an imaging apparatus including a lens having a total optical length of as compact as 3.45 mm and excellent imaging performance while having the following characteristics is provided: the spherical aberration, the astigmatism, and the distortion are well corrected as shown in FIG. 33; the numerical aperture is as large as 2.25; and the half viewing angle is as wide as 37.7 degrees.

Figure 34:
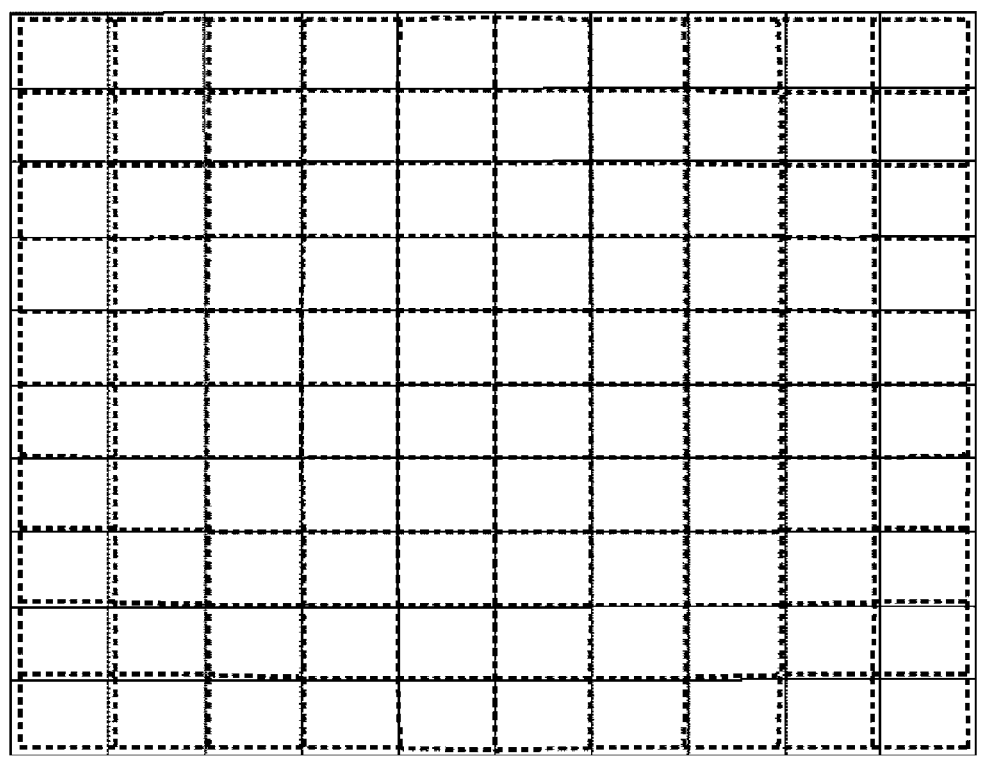
FIG. 34 shows a distortion lattice pattern in Example 10.

Further, in Example 10, the lens group 210 has large positive power and a focal length of 2.51 mm and the lens group 220 has very small positive power and a focal length of 1385 mm. A positive (pincushion-shaped) optical distortion of 16.5% produced by the thus configured lens groups 210 and 220 cancels large negative (barrel-shaped) optical distortion produced by the curved imaging device 230 and hence reduces optical distortion produced in the entire imaging apparatus to a small negative (barrel-shaped) optical distortion of 0.638% as shown in FIG. 34.

<Wafer-Level Optics>

Figure 35:
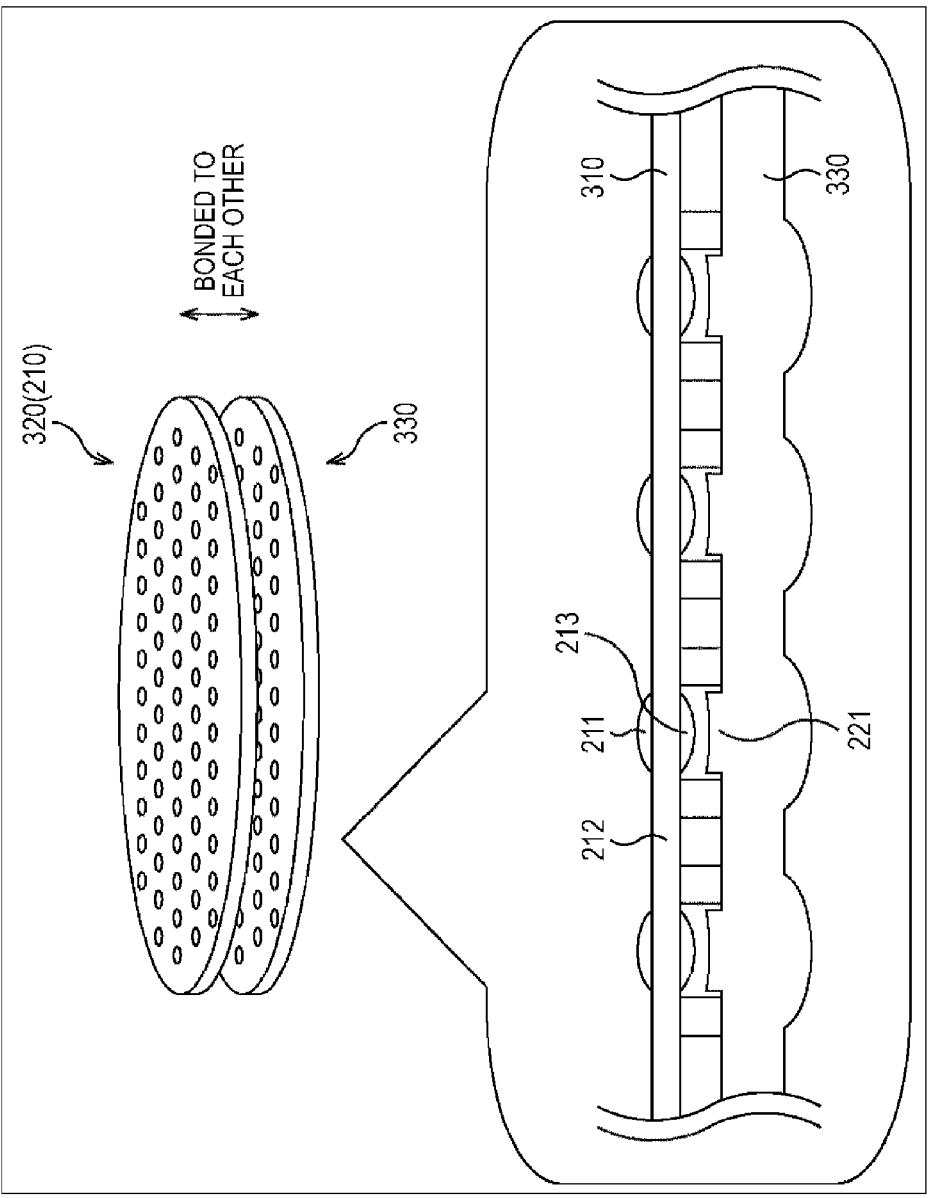
FIG. 35 describes wafer-level optics.

FIG. 35 conceptually shows wafer-level optics according to the second embodiment described above.

A large number of replica lenses are formed on upper and lower sides of a glass substrate 310. Each set of upper and lower replica lenses forms a first group 320 (210).

A large number of wafer-shaped lenses are then made of a single glass material. Each of the lenses forms a second group 330.

The two wafer-shaped lenses described above are then bonded to each other to form a large number of lenses in a single process.

To bond the two lenses, a spacer is sandwiched between the first group 320 and the second group 330, or a protector or a spacer is attached to the lower surface of the first group 320 or the upper surface of the second group 330. Further, an infrared removal filter is provided in many cases on the glass substrate 310 on which the first groups 320 have been formed.

<Example of Configuration of Electronic System>

Figure 36:
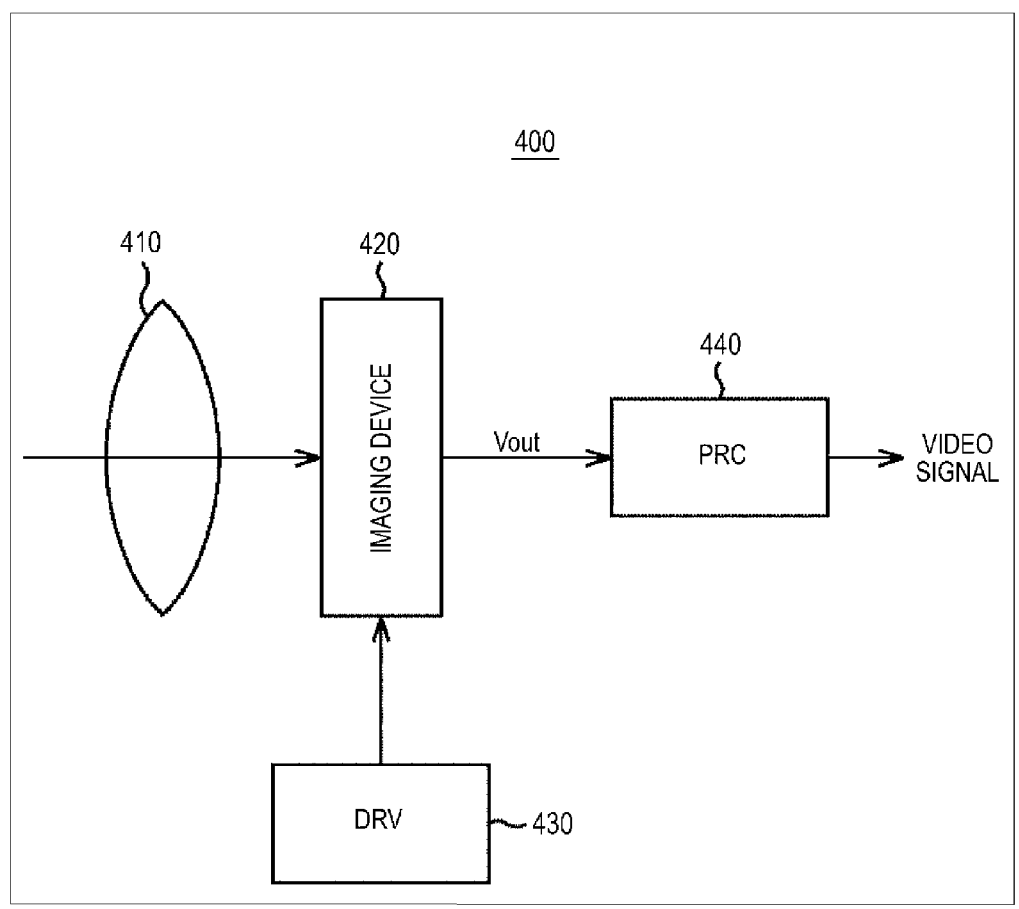
FIG. 36 is a block diagram showing an example of the configuration of an electronic system in which an imaging apparatus to which the present technology is applied is incorporated.

FIG. 36 is a block diagram showing an example of the configuration of an electronic system in which an imaging apparatus to which the present technology is applied is incorporated.

An electronic system 400 shown in FIG. 36 includes an optical system 410 in the form of the lens group 110 according to the first embodiment or the lens group 210 and the lens group 220 according to the second embodiment and an imaging device 420 in the form of the imaging device 130 according to the first embodiment or the imaging device 230 according to the second embodiment.

The optical system 410 guides incident light to an imaging surface including a pixel region of the imaging device 420 and forms a subject image.

The electronic system 400 further includes a drive circuit (DRV) 430 that drives the imaging device 420 and a signal processing circuit (PRC) 440 that processes an output signal from the imaging device 420.

The drive circuit 430 drives the imaging device 420 by using a variety of timing signals including a start pulse and a clock pulse for driving a circuit in the imaging device 420.

The signal processing circuit 440 performs predetermined signal processing on an output signal from the imaging device 420. A video signal processed by the signal processing circuit 440 is recorded on a recording medium, for example, a memory. Video information recorded on the recording medium is printed by a printer or displayed on a display or any other display apparatus.

The present technology can provide the following advantageous effects.

(1) The amount of correction of the image plane of a lens can be reduced by curving an imaging device.

(2) The angle of a line tangential to the curve at an effective diameter-equivalent outermost circumference of the imaging device (edge of light receiving surface) can be reduced.

(3) The states described in (1) and (2) prevent the imaging device from easily being broken at the effective diameter-equivalent outermost circumference of the imaging device, whereby a curved sensor can be readily provided.

(4) Since the thus provided curved sensor allows the angle of incidence of a principal ray incident on the sensor to be reduced, whereby a decrease in the amount of light at the periphery of the sensor can be smaller than the decrease calculated based on the cosine fourth law and hence the amount of light at the periphery of the sensor can be increased.

(5) Since a diaphragm and an infrared removal filter can be provided on a glass substrate, an optical system without having to be separately provided with a diaphragm or an infrared removal filter can be formed.

(6) The optical system has a lens configuration that is closer to a symmetric configuration than an optical system in a mobile phone and other similar apparatus of related art and can therefore efficiently correct asymmetric optical aberrations.

(7) In a large pixel number-capable structure in which lens elements are layered with no air gap therebetween, the optical performance of the structure can be readily enhanced with no change in the basic structure.

(8) Layering replica lenses allows the number of movable parts to be reduced as compared with a case where injection molded lenses are assembled, whereby the layered lens can be more reliable than the assembled lens.

(9) Since positive optical distortion produced by the optical system can cancel negative optical distortion produced by the curved imaging device, an advantageous effect of the lens simplification provided by curving the imaging device can be used in the most effective manner.

(10) The footprint of the imaging device can be reduced.

(11) Since a lens can be made of a reflowable glass material, the present technology can be applied to a reflowable camera.

(12) The present technology can also be applied to an optical system in which no transparent member having a optical system is used but a diaphragm is disposed in air.

Embodiments of the present technology are not limited to those described above, and a variety of changes can be made to the embodiments described above to the extent that the changes do not depart from the substance of the present technology.

The present technology can be configured as follows.

(1)

An imaging apparatus including
a lens group formed of one or more lens elements, and
an imaging device having a light receiving surface on which the lens group forms an image of an object,
wherein the light receiving surface of the imaging device is a curved surface that is concave toward the lens group, and
the light receiving surface of the imaging device has an aspheric shape so shaped that a tangential angle that is an angle between a tangential line circumscribing an edge of the light receiving surface and a plane perpendicular to an optical axis of the lens group is smaller than the tangential angle provided when the light receiving surface has a spherical shape.

(2)

The imaging apparatus described in (1),
wherein an intersection of a normal to a tangential line circumscribing the light receiving surface at 100% of an image height and the optical axis of the lens group is farther away from the light receiving surface than an intersection of a normal to a tangential line circumscribing the light receiving surface at 0 to 90% of the image height and the optical axis.

(3)

The imaging apparatus described in (1) or (2),
wherein the tangential angle at the edge of the light receiving surface is 35 degrees or smaller.

(4)

The imaging apparatus described in any of the items (1) to (3),
wherein a first lens group and a second lens group are disposed as the lens group and arranged from the side where the object is present toward the light receiving surface,
the first lens group is an in-lens-diaphragm lens group, and
each surface of the second lens group is convex toward the light receiving surface.

(5)

The imaging apparatus described in (4),
wherein a focal length f of the lens group, a focal length fg1 of the first lens group, and a focal length fg2 of the second lens group satisfy the following conditional expressions:

$$0.5 \leq fg1/f \leq 5; \text{ and}$$

$$2 \leq fg2/f \text{ or } fg2/f \leq -2.$$

(6)

The imaging apparatus described in (4) or (5),
wherein at least one of the surfaces of the second lens group has an aspheric shape.

(7)

The imaging apparatus described in any of (4) to (6),
wherein the first lens group includes:
a first lens element,
a transparent member having a diaphragm, and
a second lens element, sequentially arranged from the object side toward the light receiving surface, and
the first lens element has a surface on the object side that is convex toward the object.

(8)
The imaging apparatus described in any of (4) to (6),
wherein the first lens group includes:
a first lens element,
a second lens element,
a transparent member having a diaphragm, and
a third lens element, sequentially arranged from the object side toward the light receiving surface, and
the first lens element has a surface on the object side that is convex toward the object.

(9)
The imaging apparatus described in any of (4) to (6),
wherein the first lens group includes:
a first lens element,
a second lens element,
a third lens element,
a transparent member having a diaphragm, and
a fourth lens element, sequentially arranged from the object side toward the light receiving surface, and
the first lens element has a surface on the object side that is convex toward the object.

(10)
The imaging apparatus described in any of (4) to (6),
wherein the first lens group includes:
a first lens element having a meniscus shape,
a second lens element,
a transparent member having a diaphragm, and
a third lens element, sequentially arranged from the object side toward the light receiving surface,
the first lens element is convex toward the object,
the second lens element has a surface on the object side that is convex toward the object, and
the first lens element and the second lens element sandwich air.

(11)
The imaging apparatus described in any of (4) to (6),
wherein the first lens group includes:
a first lens element having a meniscus shape,
a second lens element,
a transparent member having a diaphragm,
a third lens element, and
a fourth lens element, sequentially arranged from the object side toward the light receiving surface,
the first lens element is convex toward the object,
the second lens element has a surface on the object side that is convex toward the object, and
the first lens element and the second lens element sandwich air.

(12)
The imaging apparatus described in any of (4) to (6),
wherein the first lens group includes:
a first lens element having a meniscus shape,
a second lens element,
a diaphragm, and
a third lens element, sequentially arranged from the object side toward the light receiving surface,
the first lens element is convex toward the object, and
the first lens element and the second lens element sandwich air and the diaphragm and the third lens element sandwich air.

(13)
The imaging apparatus described in any of (4) to (6),
wherein the first lens group includes:
a first lens element having a meniscus shape,
a diaphragm, and
a second lens element, sequentially arranged from the object side toward the light receiving surface,
the first lens element is convex toward the object,
the second lens element has a surface on the object side that is convex toward the object, and
the first lens element and the diaphragm sandwich air and the diaphragm and the second lens element sandwich air.

(14)
The imaging apparatus described in any of (1) to (3),
wherein the lens group includes:
a first lens element,
a transparent member having a diaphragm, and
a second lens element, sequentially arranged from the side where the object is present toward the light receiving surface, and
the first lens element has a surface on the object side that is convex toward the object.

(15)
The imaging apparatus described in any of (1) to (3),
wherein the lens group includes:
a first lens element,
a second lens element,
a transparent member having a diaphragm, and
a third lens element, sequentially arranged from the object side toward the light receiving surface, and
the first lens element has a surface on the object side that is convex toward the object.

(16)
The imaging apparatus described in any of (1) to (3),
wherein the lens group includes:
a first lens element,
a second lens element,
a third lens element,
a transparent member having a diaphragm, and
a fourth lens element, sequentially arranged from the object side toward the light receiving surface, and
the first lens element has a surface on the object side that is convex toward the object.

(17)
The imaging apparatus described in any of (1) to (16),
wherein the lens group produces positive optical distortion.

(18)
The imaging apparatus described in (17),
wherein the amount of optical distortion is 5% or greater.

(19) The imaging apparatus described in any of (1) to (3),
wherein an effective radius of the lens group D_lens and an effective radius of the imaging device D_im satisfy the following conditional expression:

$$0.35 < D\_lens/D\_im < 0.75.$$

(20) An electronic system including an imaging apparatus,
wherein the imaging apparatus includes
a lens group formed of one or more lens elements, and
an imaging device having a light receiving surface on which the lens group forms an image of an object,
the light receiving surface of the imaging device is a curved surface that is concave toward the lens group, and
the light receiving surface of the imaging device has an aspheric shape so shaped that a tangential angle that is an angle between a tangential line circumscribing an edge of the light receiving surface and a plane perpendicular to an optical axis of the lens group is smaller than the tangential angle provided when the light receiving surface has a spherical shape.

The present disclosure contains subject matter related to that disclosed in Japanese Priority Patent Application JP 2012-100679 filed in the Japan Patent Office on Apr. 26, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus comprising:
   a lens group formed of one or more lens elements; and
   an imaging device having a light receiving surface on which the lens group forms an image of an object,
   wherein the light receiving surface of the imaging device is a curved surface that is concave toward the lens group,
   wherein the light receiving surface of the imaging device has an aspheric shape such that a tangential angle between a tangential line circumscribing an outermost circumferential portion at a boundary of the curved surface and a flat portion surrounding the curved surface of the light receiving surface and a plane perpendicular to an optical axis of the lens group is smaller than the tangential angle provided when the light receiving surface has a spherical shape, and
   wherein a first intersection is farther away from the light receiving surface than a second intersection, wherein the first intersection is an intersection of a normal to a tangential line circumscribing the light receiving surface at 100% of an image height and the optical axis of the lens group, and wherein the second intersection is an intersection of a normal to a tangential line circumscribing the light receiving surface at 0 to 90% of the image height and the optical axis.

2. The imaging apparatus according to claim 1, wherein the tangential angle at the outermost circumferential portion of the light receiving surface is 35 degrees or smaller.

3. The imaging apparatus according to claim 1, wherein
   a first lens group and a second lens group are disposed as the lens group and arranged from the side where the object is present toward the light receiving surface,
   the first lens group is an in-lens-diaphragm lens group, and
   each surface of the second lens group is convex toward the light receiving surface.

4. The imaging apparatus according to claim 3, wherein a focal length f of the lens group, a focal length fg1 of the first lens group, and a focal length fg2 of the second lens group satisfy the following conditional expressions:

$$0.5 \leq fg1/f \leq 5$$

$$2 \leq fg2/f \text{ or } fg2/f \leq 2.$$

5. The imaging apparatus according to claim 3, wherein at least one of the surfaces of the second lens group has an aspheric shape.

6. The imaging apparatus according to claim 3, wherein the first lens group includes:
   a first lens element,
   a transparent member having a diaphragm, and
   a second lens element, sequentially arranged from the object side toward the light receiving surface, and
   the first lens element has a surface on the object side that is convex toward the object.

7. The imaging apparatus according to claim 3, wherein the first lens group includes:
   a first lens element,
   a second lens element,
   a transparent member having a diaphragm, and
   a third lens element, sequentially arranged from the object side toward the light receiving surface, and
   the first lens element has a surface on the object side that is convex toward the object.

8. The imaging apparatus according to claim 3, wherein the first lens group includes:
   a first lens element,
   a second lens element,
   a third lens element,
   a transparent member having a diaphragm, and
   a fourth lens element, sequentially arranged from the object side toward the light receiving surface, and
   the first lens element has a surface on the object side that is convex toward the object.

9. The imaging apparatus according to claim 3, wherein the first lens group includes:
   a first lens element having a meniscus shape,
   a second lens element,
   a transparent member having a diaphragm, and
   a third lens element, sequentially arranged from the object side toward the light receiving surface,
   the first lens element is convex toward the object,
   the second lens element has a surface on the object side that is convex toward the object, and
   the first lens element and the second lens element sandwich air.

10. The imaging apparatus according to claim 3, wherein the first lens group includes:
    a first lens element having a meniscus shape,
    a second lens element,
    a transparent member having a diaphragm,
    a third lens element, and
    a fourth lens element sequentially arranged from the object side toward the light receiving surface,
    the first lens element is convex toward the object,
    the second lens element has a surface on the object side that is convex toward the object, and
    the first lens element and the second lens element sandwich air.

11. The imaging apparatus according to claim 3, wherein the first lens group includes:
    a first lens element having a meniscus shape,
    a second lens element,
    a diaphragm, and
    a third lens element, sequentially arranged from the object side toward the light receiving surface,
    the first lens element is convex toward the object, and
    the first lens element and the second lens element sandwich air and the diaphragm and the third lens element sandwich air.

12. The imaging apparatus according to claim 3, wherein the first lens group includes:
    a first lens element having a meniscus shape,
    a diaphragm, and
    a second lens element, sequentially arranged from the object side toward the light receiving surface,
    the first lens element is convex toward the object,
    the second lens element has a surface on the object side that is convex toward the object, and
    the first lens element and the diaphragm sandwich air and the diaphragm and the second lens element sandwich air.

13. The imaging apparatus according to claim 1, wherein the lens group includes:
a first lens element,
a transparent member having a diaphragm, and
a second lens element, sequentially arranged from the side where the object is present toward the light receiving surface, and
the first lens element has a surface on the object side that is convex toward the object.

14. The imaging apparatus according to claim 1, wherein the lens group includes:
a first lens element,
a second lens element,
a transparent member having a diaphragm, and
a third lens element, sequentially arranged from the object side toward the light receiving surface, and
the first lens element has a surface on the object side that is convex toward the object.

15. The imaging apparatus according to claim 1, wherein the lens group includes:
a first lens element,
a second lens element,
a third lens element,
a transparent member having a diaphragm, and
a fourth lens element, sequentially arranged from the object side toward the light receiving surface, and
the first lens element has a surface on the object side that is convex toward the object.

16. The imaging apparatus according to claim 1, wherein the lens group produces positive optical distortion.

17. The imaging apparatus according to claim 16, wherein the amount of optical distortion is 5% or greater.

18. The imaging apparatus according to claim 1, wherein an effective radius of the lens group D_lens and an effective radius of the imaging device D_im satisfy the following conditional expression: 0.35<D_lens/D_im<0.75.

19. An electronic system comprising an imaging apparatus, wherein the imaging apparatus includes
a lens group formed of one or more lens elements; and
an imaging device having a light receiving surface on which the lens group forms an image of an object,
wherein the light receiving surface of the imaging device is a curved surface that is concave toward the lens group,
wherein the light receiving surface of the imaging device has an aspheric shape such that a tangential angle between a tangential line circumscribing an outermost circumferential portion at a boundary of the curved surface and a flat portion surrounding the curved surface of the light receiving surface and a plane perpendicular to an optical axis of the lens group is smaller than the tangential angle provided when the light receiving surface has a spherical shape, and
wherein a first intersection is farther away from the light receiving surface than a second intersection, wherein the first intersection is an intersection of a normal to a tangential line circumscribing the light receiving surface at 100% of an image height and the optical axis of the lens group, and wherein the second intersection is an intersection of a normal to a tangential line circumscribing the light receiving surface at 0 to 90% of the image height and the optical axis.

* * * * *